US012040329B2

(12) United States Patent
Lan et al.

(10) Patent No.: US 12,040,329 B2
(45) Date of Patent: Jul. 16, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Wen-Ting Lan, Hsinchu (TW); Shi Ning Ju, Hsinchu (TW); Kuo-Cheng Chiang, Hsinchu (TW); Kuan-Lun Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/200,735

(22) Filed: May 23, 2023

(65) Prior Publication Data

US 2023/0290780 A1    Sep. 14, 2023

Related U.S. Application Data

(62) Division of application No. 17/225,907, filed on Apr. 8, 2021, now Pat. No. 11,664,378.

(51) Int. Cl.
| | | |
|---|---|---|
| *H01L 29/76* | (2006.01) | |
| *H01L 21/8234* | (2006.01) | |
| *H01L 27/092* | (2006.01) | |
| *H01L 29/417* | (2006.01) | |
| *H01L 29/66* | (2006.01) | |

(Continued)

(52) U.S. Cl.
CPC .. *H01L 27/0924* (2013.01); *H01L 21/823431* (2013.01); *H01L 29/41791* (2013.01); *H01L 29/66795* (2013.01); *H01L 29/7851* (2013.01)

(58) Field of Classification Search
CPC ......... H01L 27/0924; H01L 21/823431; H01L 29/41791; H01L 29/66795; H01L 29/7851; H01L 29/0673; H01L 29/0847; H01L 29/66545; H01L 29/775; H01L 27/088; H01L 29/1079; H01L 29/165; H01L 29/6653; H01L 29/7848; H01L 29/42392; H01L 29/66439; H01L 29/78696; H01L 29/0684; H01L 29/785; B82Y 10/00; Y02P 90/02
USPC ....................................................... 257/288
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Theresa T Doan
(74) *Attorney, Agent, or Firm* — NZ CARR LAW OFFICE

(57) ABSTRACT

A semiconductor device structure, along with methods of forming such, are described. The structure includes a semiconductor fin having a first portion having a first width and a second portion having a second width substantially less than the first width. The first portion has a first surface, the second portion has a second surface, and the first and second surfaces are connected by a third surface. The third surface forms an angle with respect to the second surface, and the angle ranges from about 90 degrees to about 130 degrees. The structure further includes a gate electrode layer disposed over the semiconductor fin and source/drain epitaxial features disposed on the semiconductor fin on opposite sides of the gate electrode layer.

20 Claims, 20 Drawing Sheets

(51) Int. Cl.
*H01L 29/78* (2006.01)
*H01L 29/94* (2006.01)

(56) References Cited

U.S. PATENT DOCUMENTS

| | | | |
|---|---|---|---|
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,483,380 B2 * | 11/2019 | Afzalian | H01L 29/66977 |
| 10,720,431 B1 * | 7/2020 | Cheng | H01L 29/66469 |
| 2015/0079752 A1 | 3/2015 | Wu et al. | |

* cited by examiner

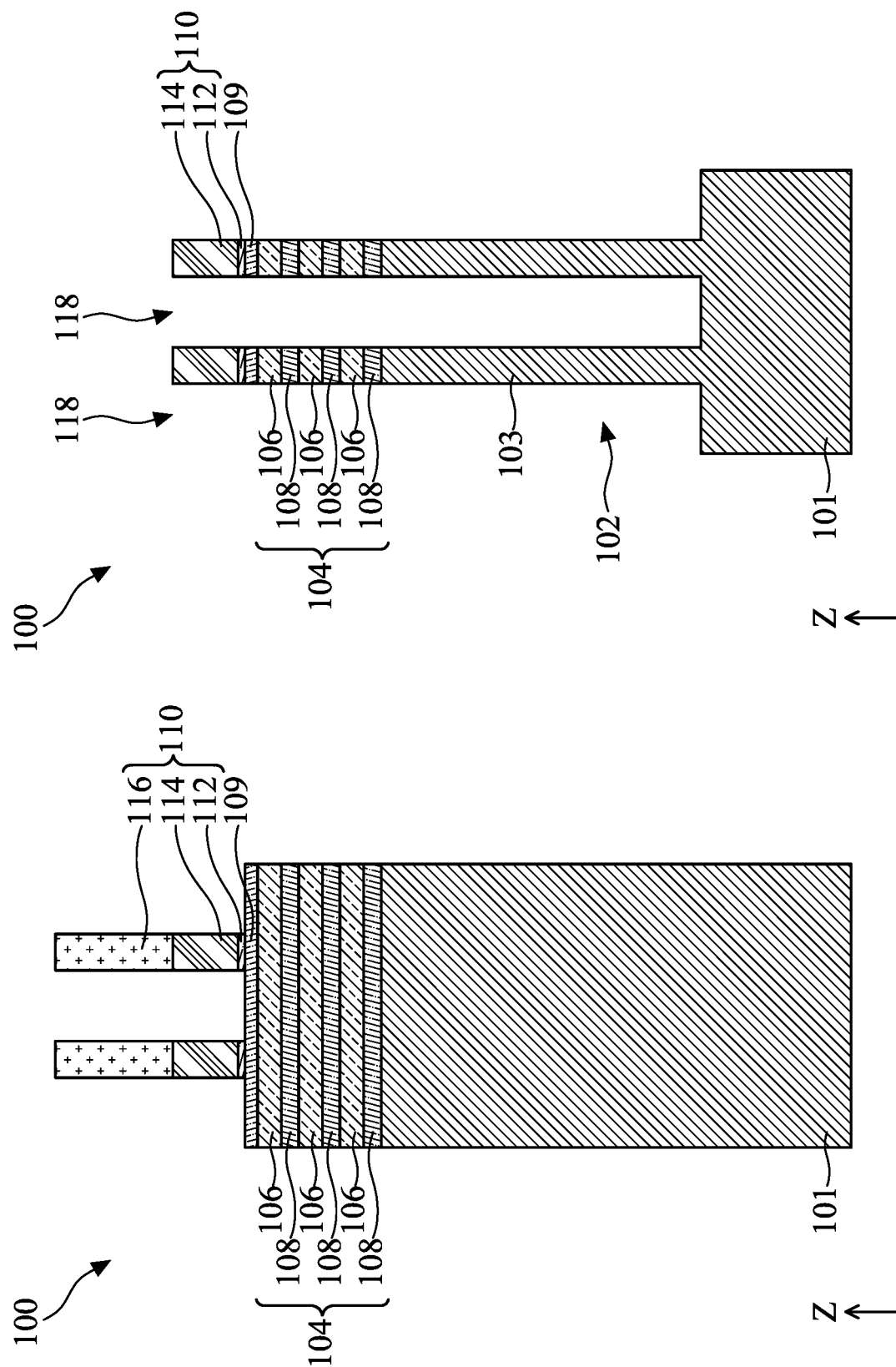

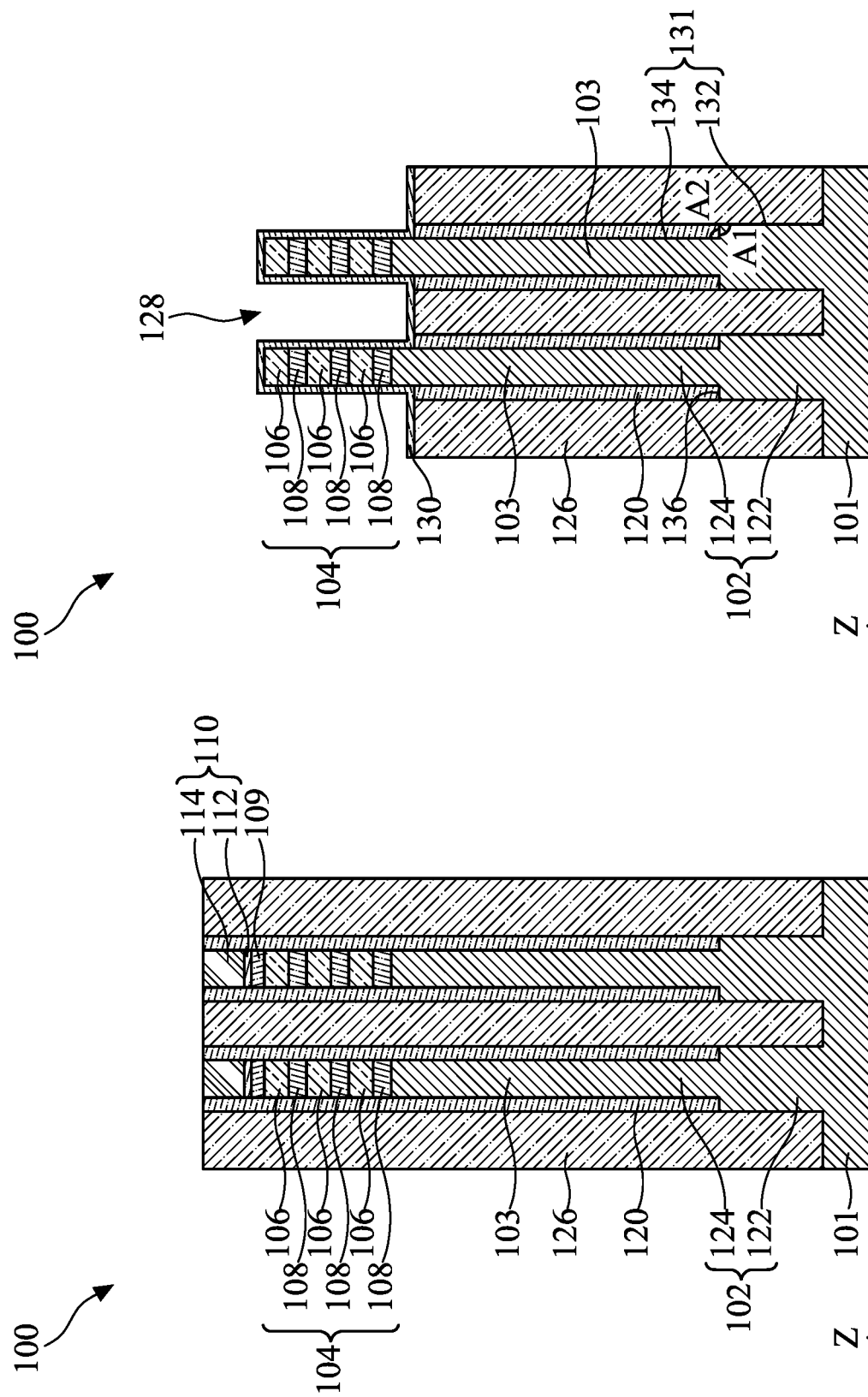

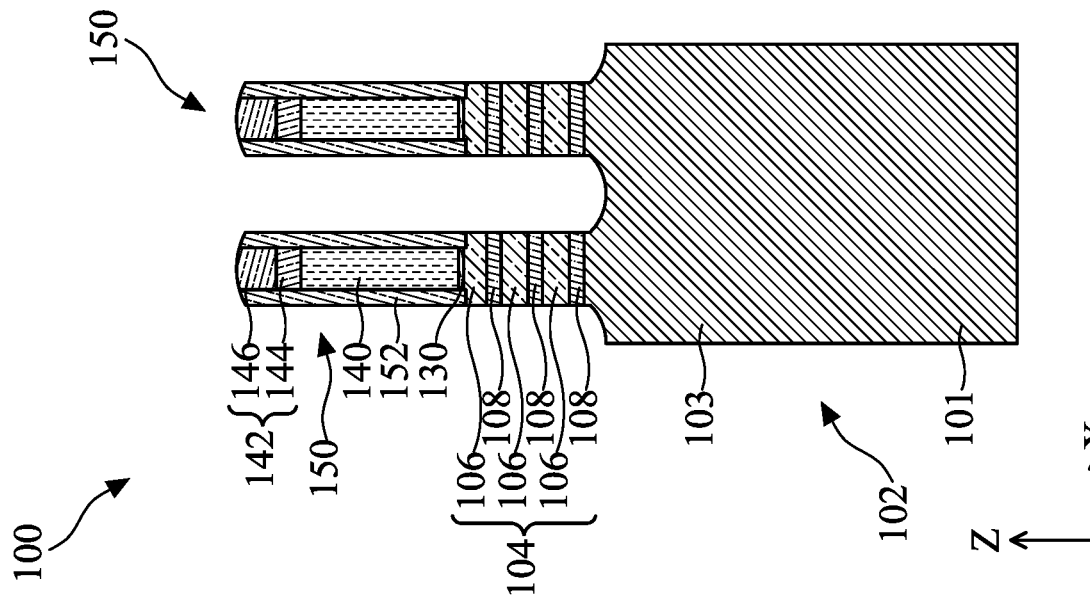
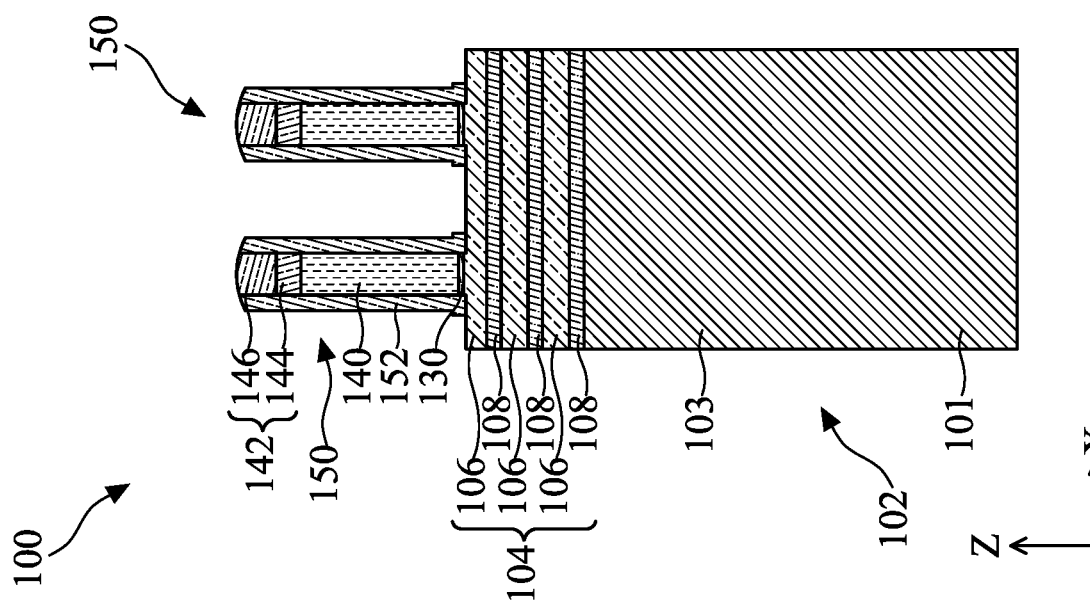
Fig. 3C
Fig. 3B

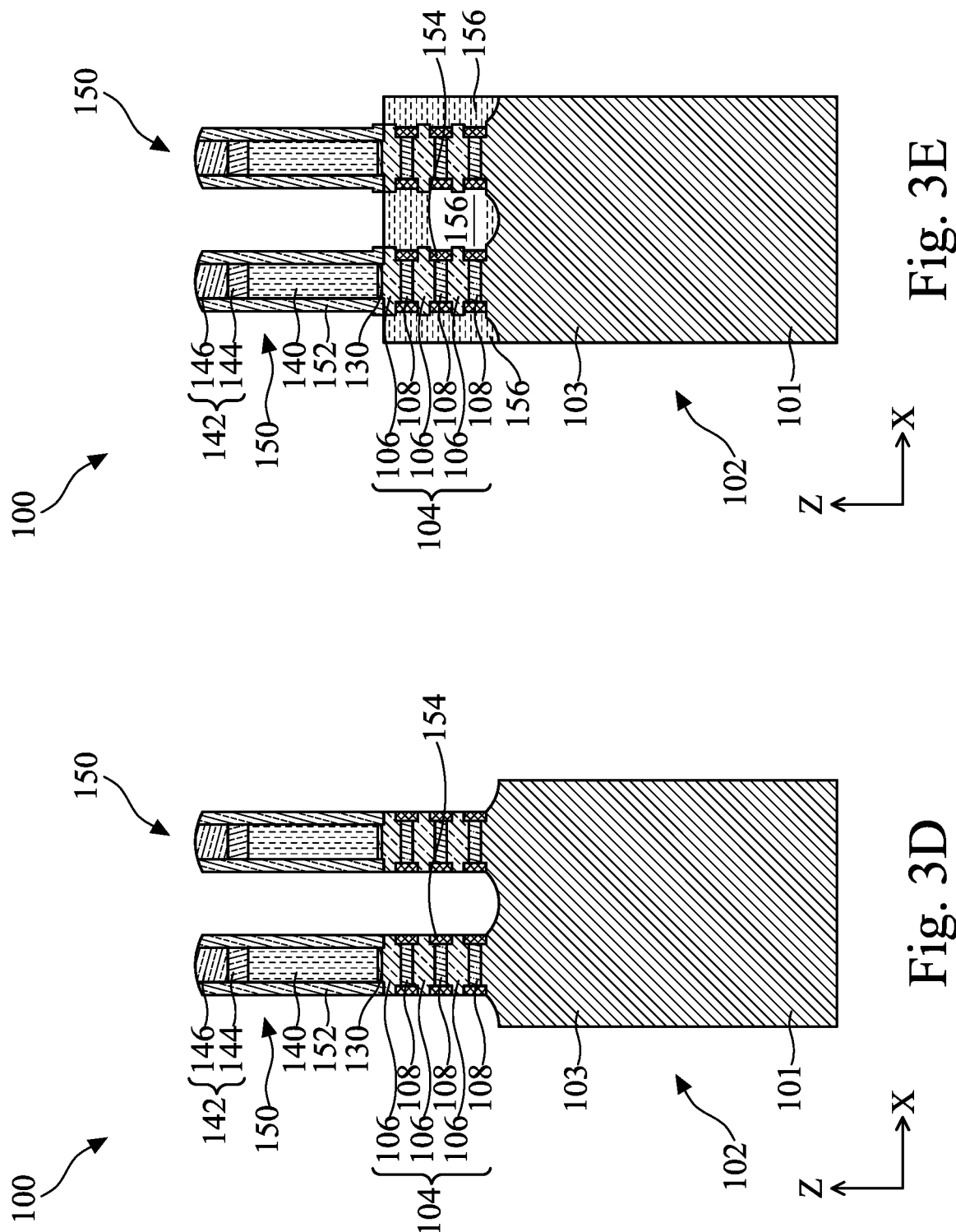

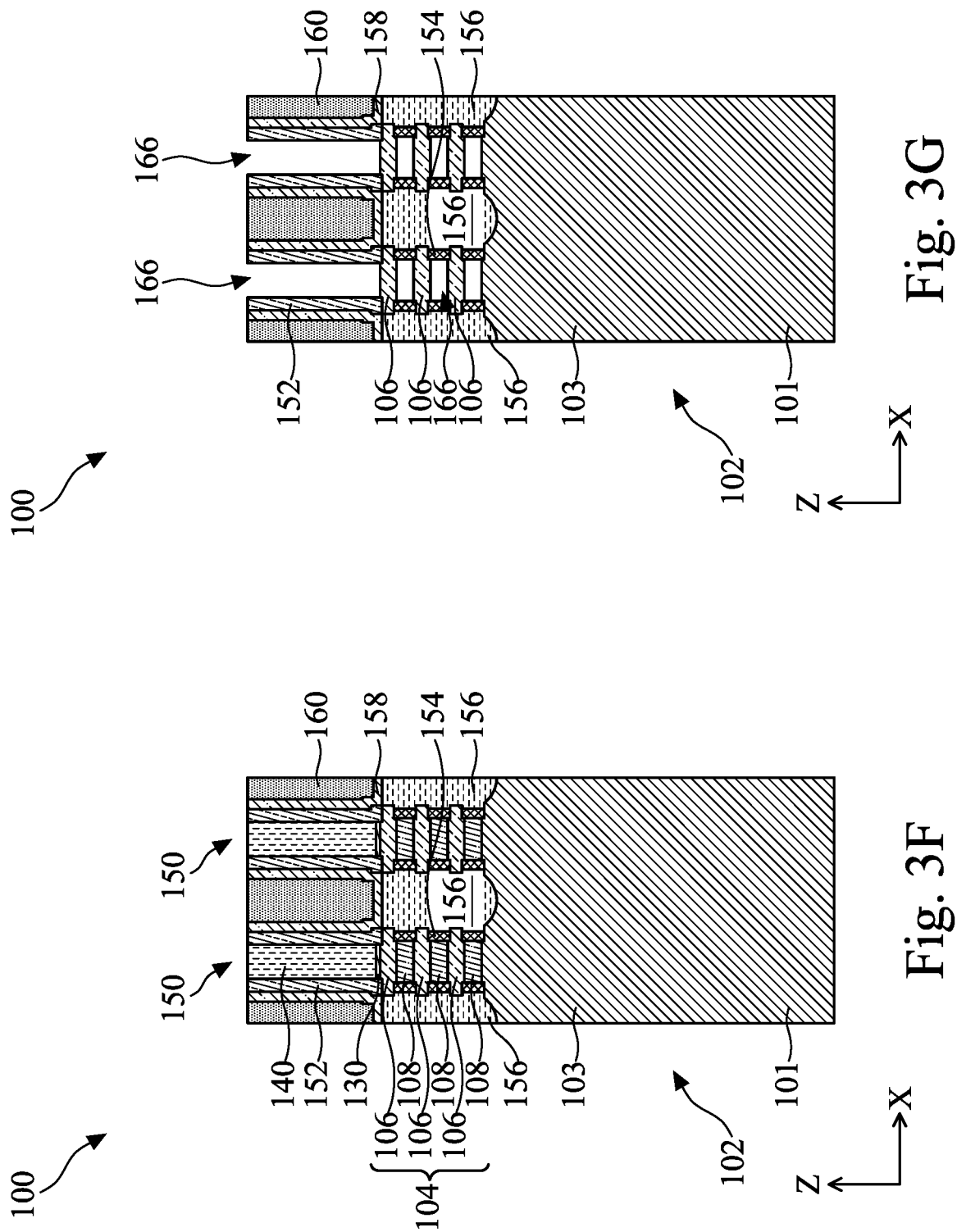

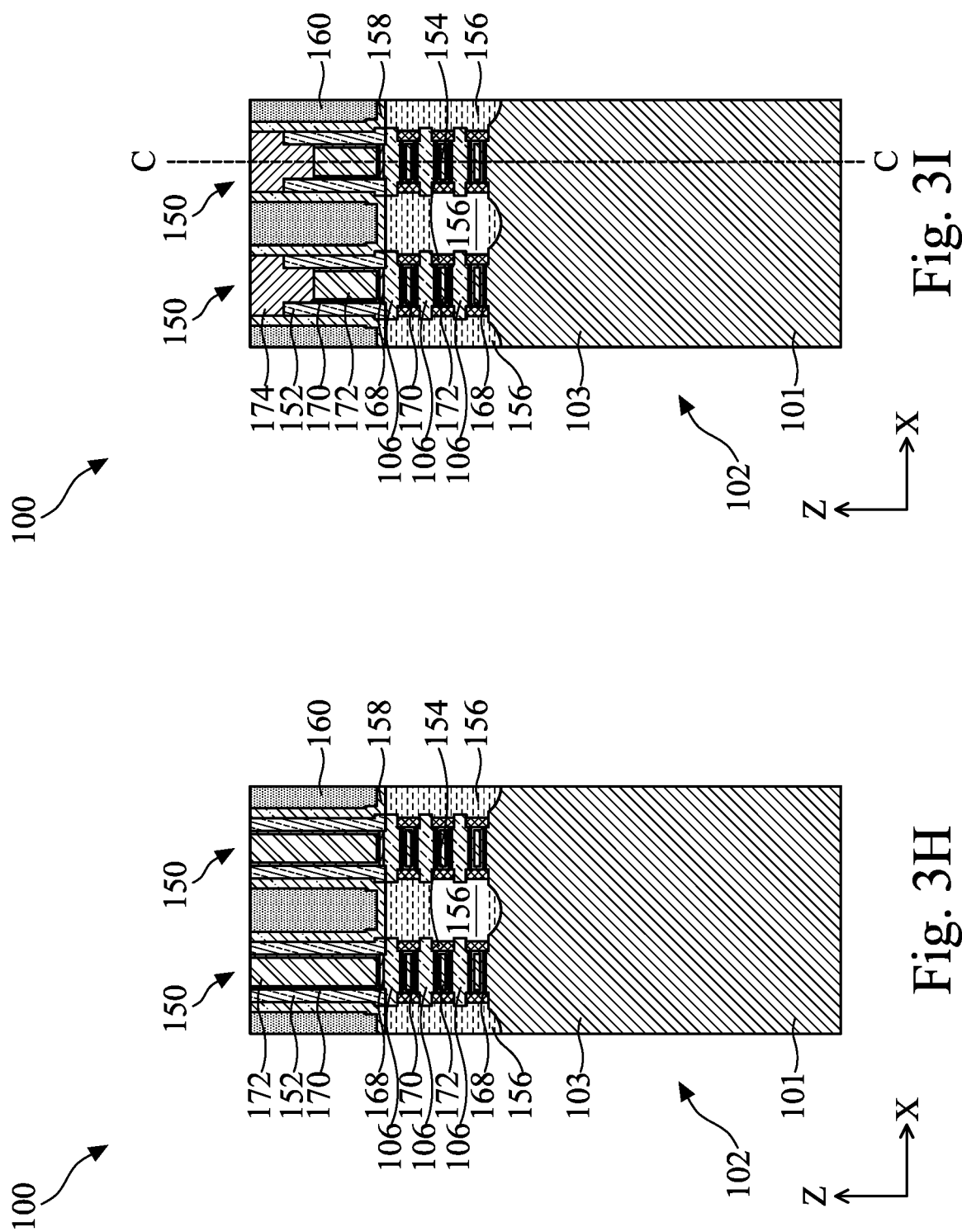

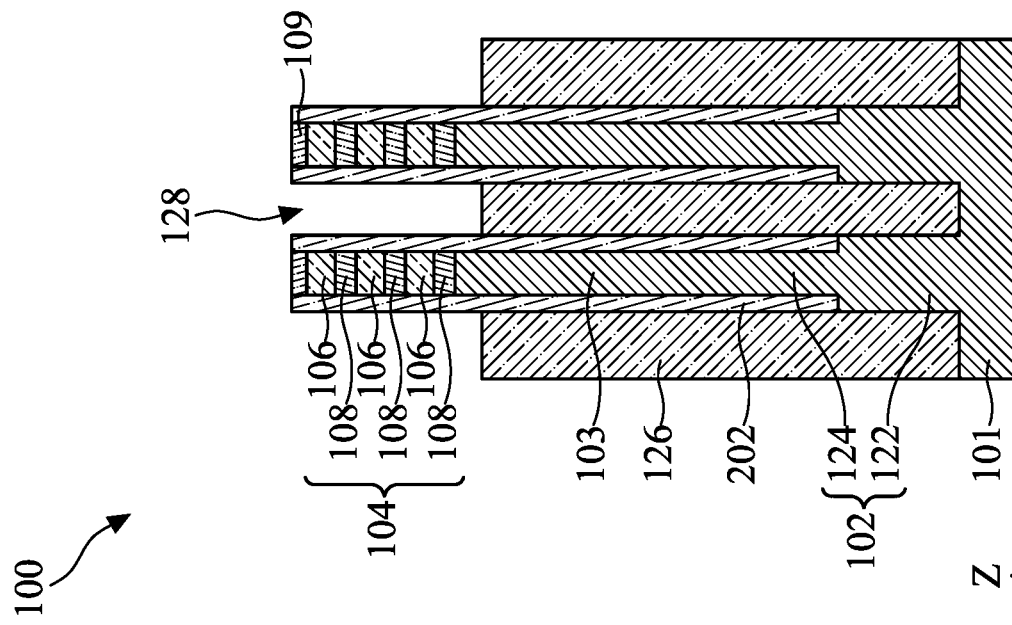
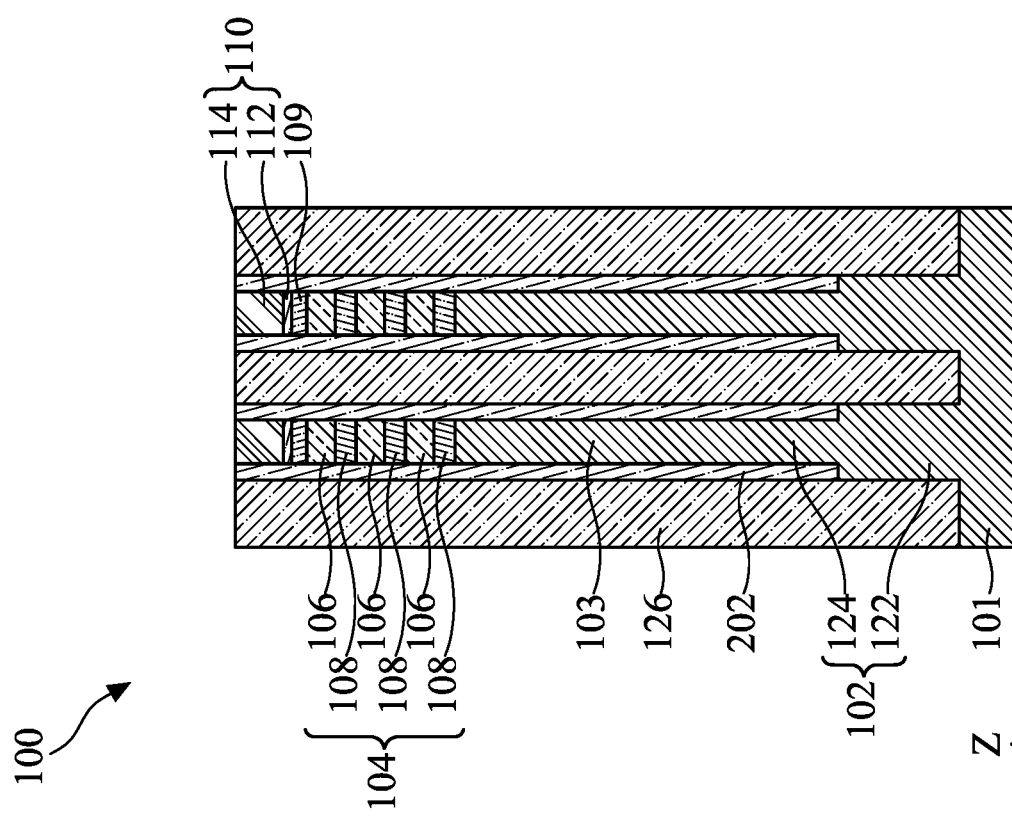
Fig. 5C
Fig. 5D

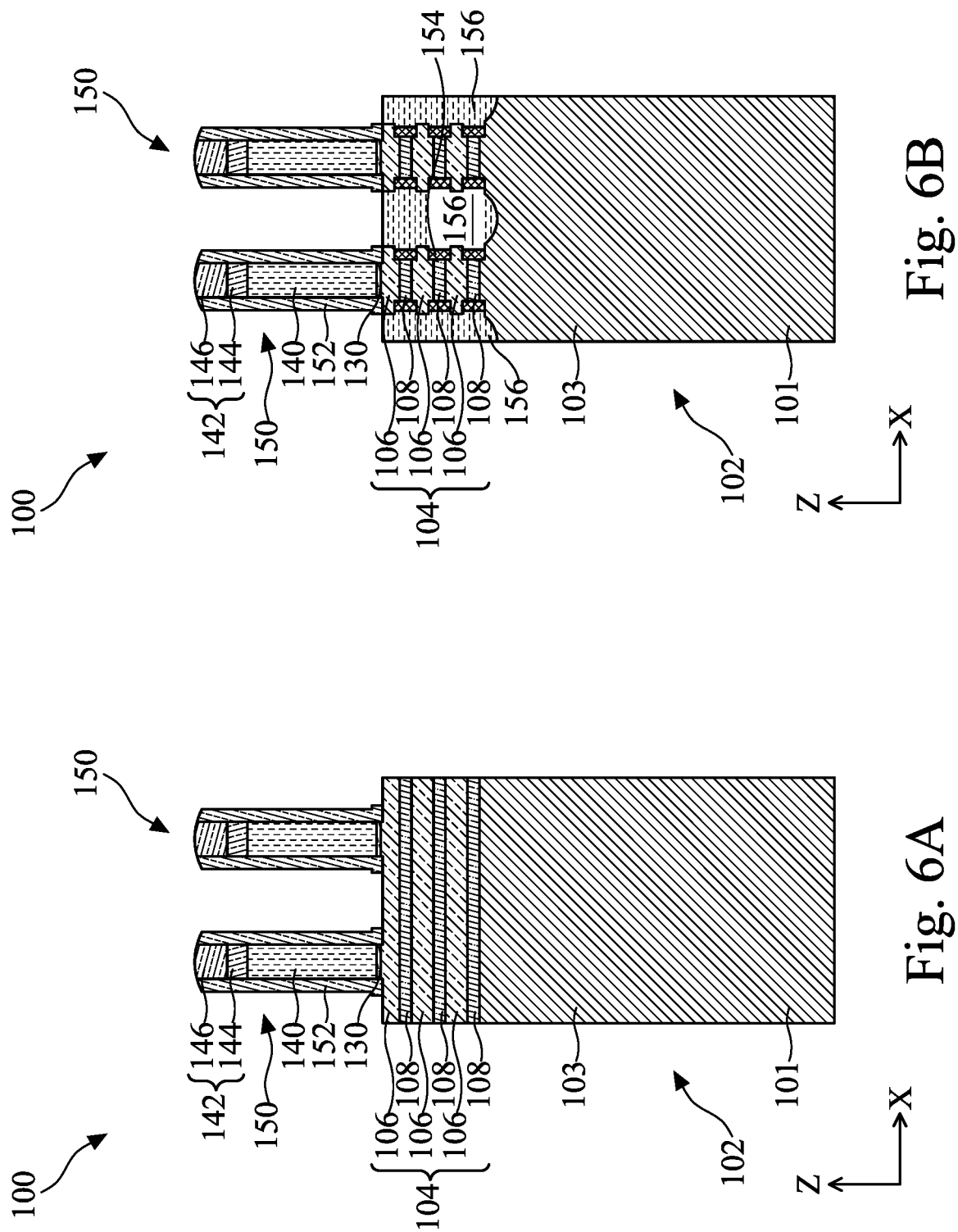

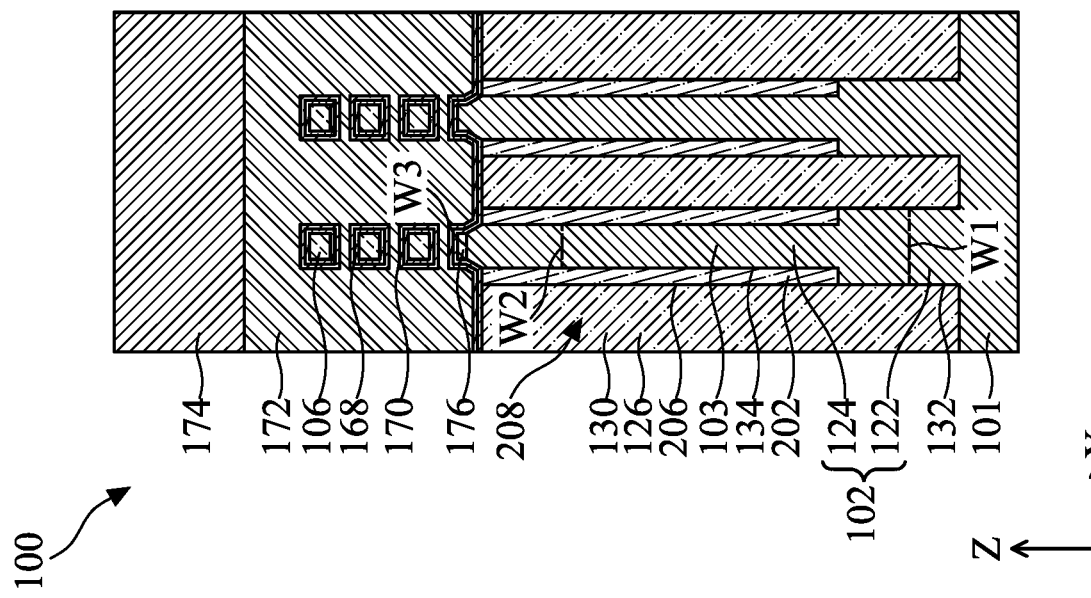
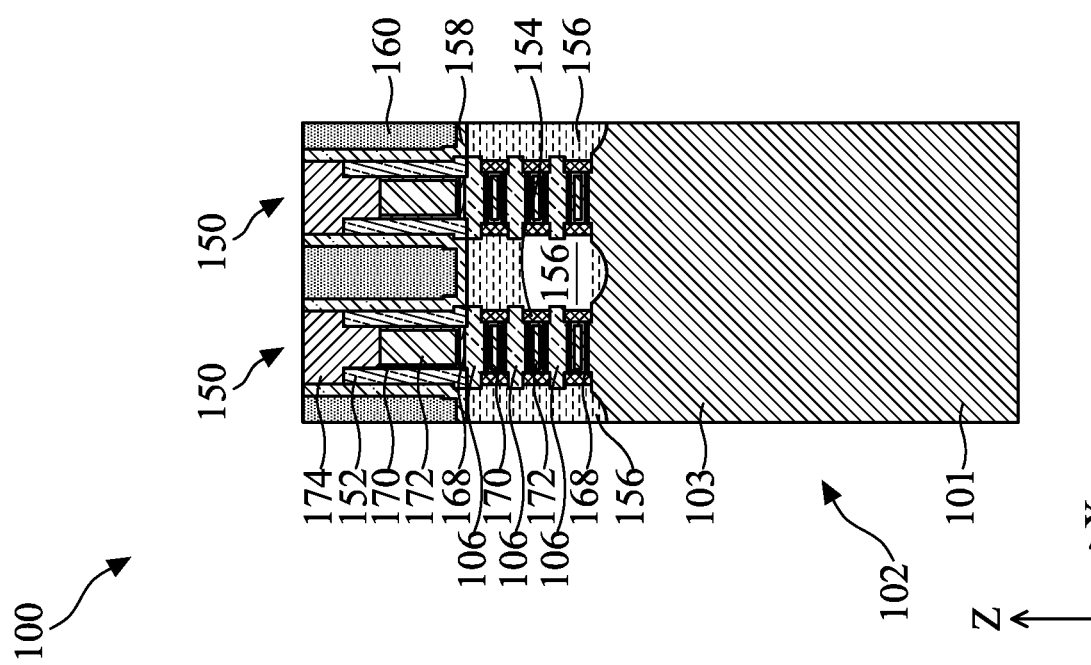
Fig. 7
Fig. 6C

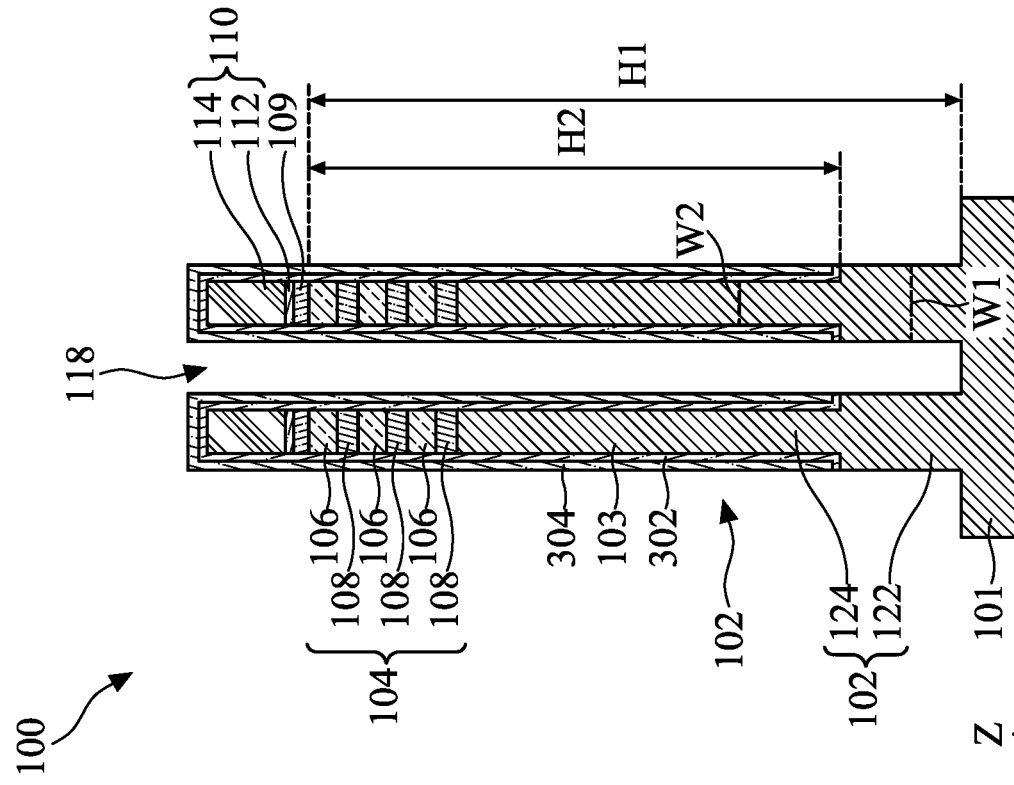
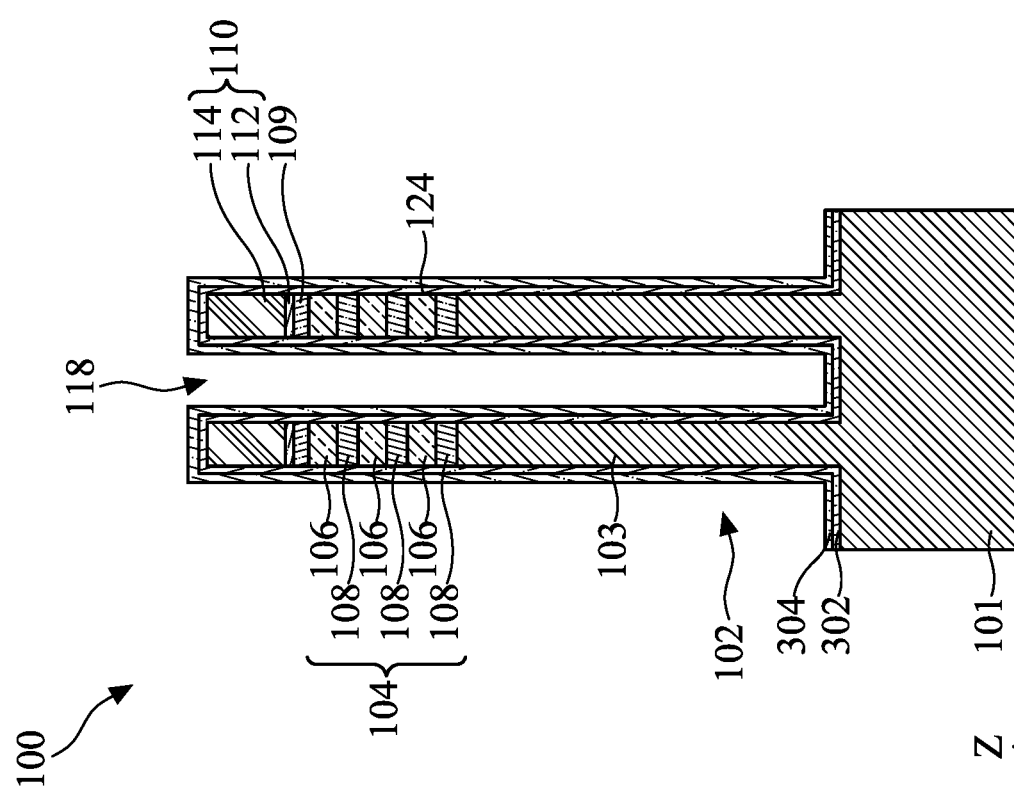

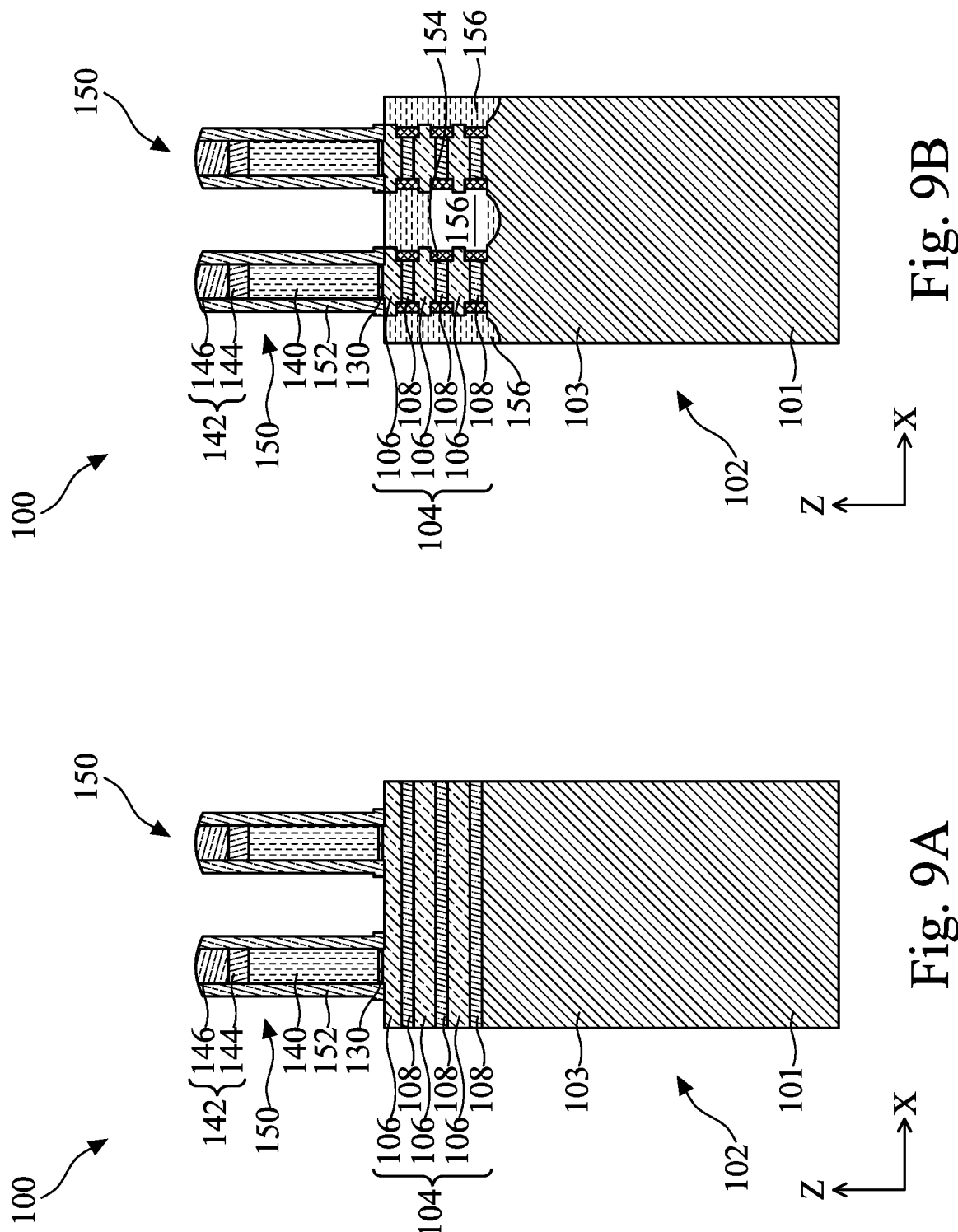

SEMICONDUCTOR DEVICE STRUCTURE AND METHODS OF FORMING THE SAME

CROSS-REFERENCE TO RELATED APPLICATIONS

This application is a divisional application of U.S. patent application Ser. No. 17/225,907 filed Apr. 8, 2021, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2G are cross-sectional side views of various stages of manufacturing the semiconductor device structure taken along line A-A of FIG. 1, in accordance with some embodiments.

FIGS. 3A-3I are cross-sectional side views of various stages of manufacturing the semiconductor device structure taken along line B-B of FIG. 2G, in accordance with some embodiments.

FIGS. 5A-5F are cross-sectional side views of various stages of manufacturing the semiconductor device structure taken along line A-A of FIG. 1, in accordance with alternative embodiments.

FIGS. 6A-6C are cross-sectional side views of various stages of manufacturing the semiconductor device structure taken along line B-B of FIG. 2G, in accordance with alternative embodiments.

FIG. 7 is a cross-sectional side view of one of various stages of manufacturing the semiconductor device structure taken along line C-C of FIG. 3I, in accordance with alternative embodiments.

FIGS. 8A-8F are cross-sectional side views of various stages of manufacturing the semiconductor device structure taken along line A-A of FIG. 1, in accordance with alternative embodiments.

FIGS. 9A-9C are cross-sectional side views of various stages of manufacturing the semiconductor device structure taken along line B-B of FIG. 2G, in accordance with alternative embodiments.

DETAILED DESCRIPTION

Figure 1:
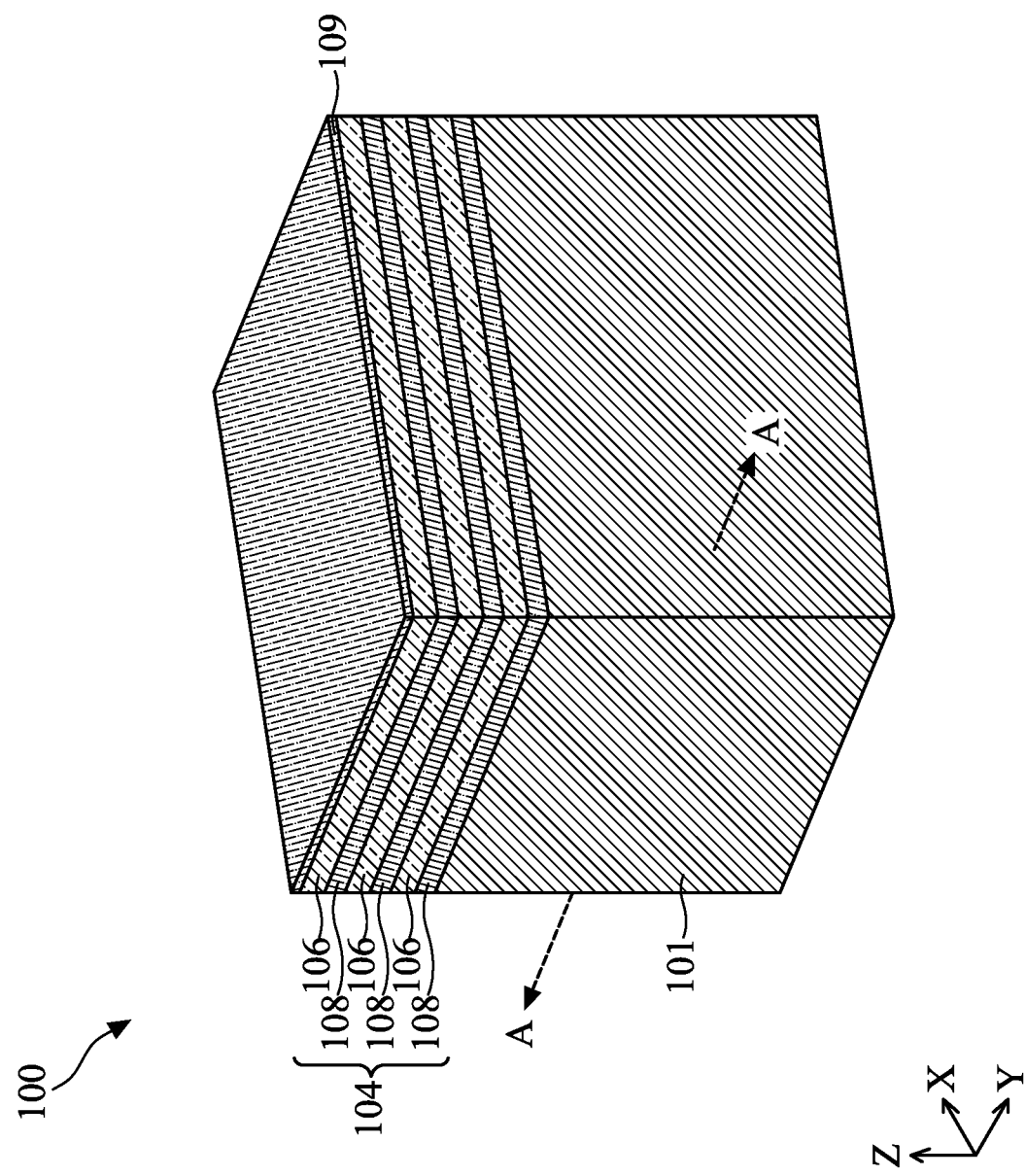
FIG. 1 is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-4 show exemplary sequential processes for manufacturing a semiconductor device structure 100, in accordance with some embodiments. It is understood that additional operations can be provided before, during, and after processes shown by FIGS. 1-4 and some of the operations described below can be replaced or eliminated, for additional embodiments of the method. The order of the operations/processes may be interchangeable.

FIG. 1 is a perspective view of one of various stages of manufacturing the semiconductor device structure 100, in accordance with some embodiments. As shown in FIG. 1, a stack of semiconductor layers 104 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various doped regions that have been suitably doped with impurities (e.g., p-type or n-type impurities). The dopants are, for example boron for a p-type field effect transistor (FET) and phosphorus for an n-type FET.

The stack of semiconductor layers 104 includes first semiconductor layers 106 and second semiconductor layers 108. The first semiconductor layers 106 and the second semiconductor layers 108 are made of semiconductor materials having different etch selectivity and/or oxidation rates. For example, the first semiconductor layers 106 are made of Si and the second semiconductor layers 108 are made of SiGe. In some embodiments, the stack of semiconductor layers 104 includes alternating first and second semiconductor layers 106, 108. The first semiconductor layers 106 or portions thereof may form nanostructure channel(s) of the semiconductor device structure 100 at a later stage. The semiconductor device structure 100 may include a nanostructure transistor. The term nanostructure is used herein to designate any material portion with nanoscale, or even microscale dimensions, and having any suitable shape, such as an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanostructure channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. The use of the first semiconductor layers 106 to define a channel or channels of the semiconductor device structure 100 is further discussed below.

It is noted that 3 layers of the first semiconductor layers 106 and 3 layers of the second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104; the number of layers depending on the predetermined number of channels for the semiconductor device structure 100. In some embodiments, the number of first semiconductor layers 106, which is the number of channels, is between 2 and 8, such as between 2 and 3.

As described in more detail below, the first semiconductor layers 106 may serve as channels for the semiconductor device structure 100 and the thickness is chosen based on device performance considerations. In some embodiments, each first semiconductor layer 106 has a thickness ranging from about 6 nanometers (nm) to about 12 nm. The second semiconductor layers 108 may eventually be removed and serve to define a vertical distance between adjacent channels for the semiconductor device structure 100 and the thickness is chosen based on device performance considerations. In some embodiments, each second semiconductor layer 108 has a thickness ranging from about 2 nm to about 6 nm.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

A cap layer 109 may be formed on the stack of semiconductor layers 104, as shown in FIG. 1. The cap layer 109 may include a semiconductor material, such as SiGe. In some embodiments, the cap layer 109 includes the same material as the second semiconductor layer 108.

Figure 2D:
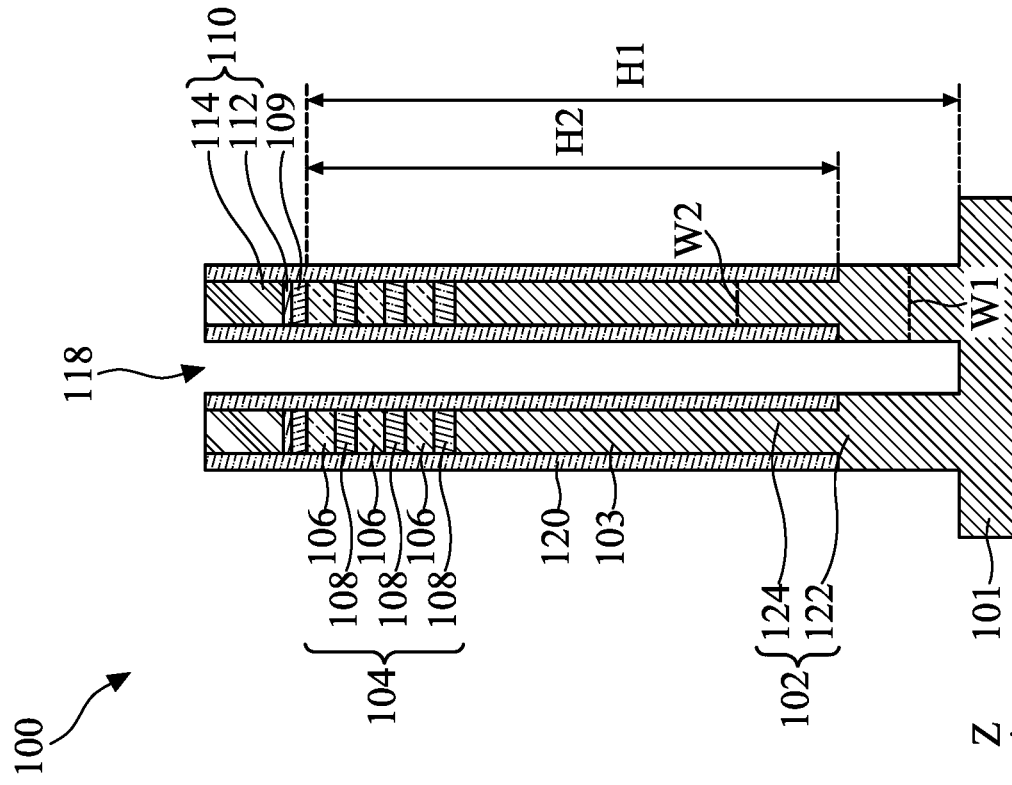

FIGS. 2A-2G are cross-sectional side views of various stages of manufacturing the semiconductor device structure 100 taken along line A-A of FIG. 1, in accordance with some embodiments. As shown in FIG. 2A, mask structures 110 are formed over the stack of semiconductor layers 104. The mask structure 110 may include an oxygen-containing layer 116, a nitrogen-containing layer 114, and an oxygen-containing layer 112. The oxygen-containing layers 112, 116 may each be a pad oxide layer, such as a $SiO_2$ layer. The nitrogen-containing layer 114 may be a pad nitride layer, such as $Si_3N_4$. The mask structures 110 may be formed by any suitable deposition process, such as chemical vapor deposition (CVD) process.

As shown in FIG. 2B, fins 102 are formed. In some embodiments, each fin 102 includes a substrate portion 103 formed from the substrate 101, a portion of the stack of semiconductor layers 104, and a portion of the mask structure 110. The oxygen-containing layer 116 may be removed during the formation of the fins 102. The fins 102 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 102 by etching the stack of semiconductor layers 104 and the substrate 101. The etch process can include dry etch, wet etch, reactive ion etch (RIE), and/or other suitable processes. As shown in FIG. 2, two fins are formed, but the number of the fins is not limited to two.

In some embodiments, the fins 102 may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 118 in unprotected regions through the mask structure 110, the stack of semiconductor layers 104, and into the substrate 101, thereby leaving the extending fins 102. The trenches 118 may be etched using a dry etch (e.g., RIE), a wet etch, and/or combination thereof.

Figure 2C:
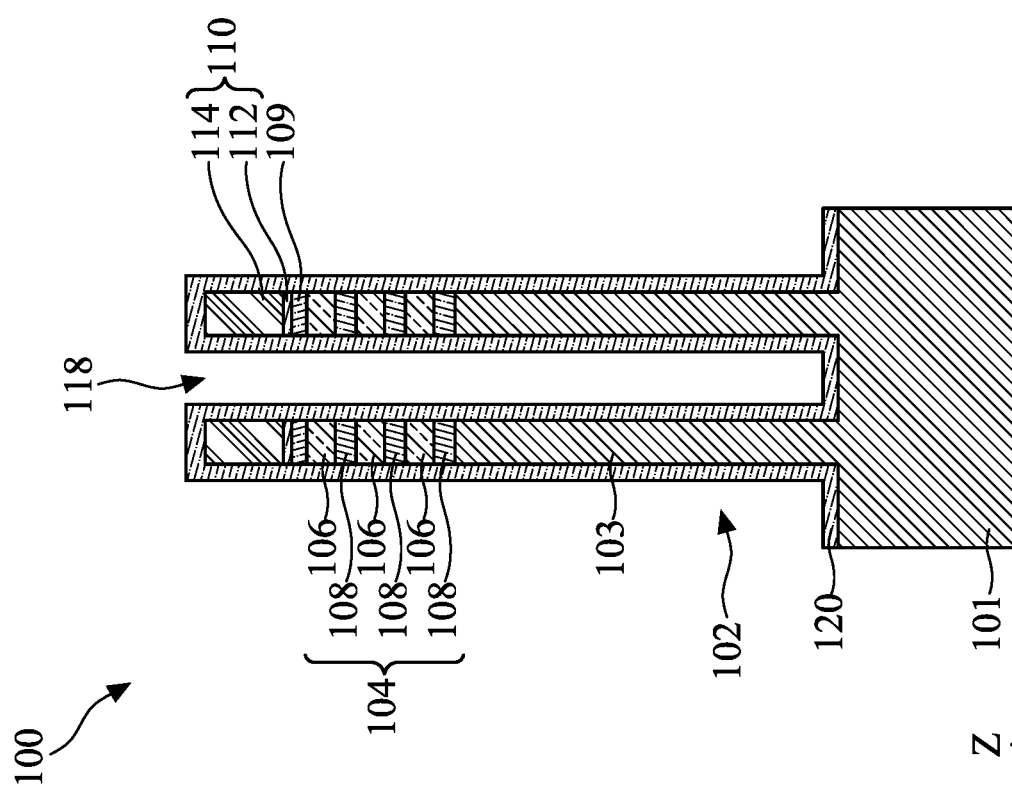

As shown in FIG. 2C, a liner 120 is formed on the substrate 101 and the fins 102. The liner 120 may include a dielectric material, such as an oxide, for example silicon dioxide. The liner 120 may be a conformal layer formed by a conformal process, such as atomic layer deposition (ALD). The term "conformal" may be used herein for ease of description upon a layer having substantial same thickness over various regions. The liner 120 may have a thickness ranging from about 1 nm to about 5 nm.

As shown in FIG. 2D, portions of the liner 120 formed on horizontal surfaces are removed to expose portions of the substrate 101, and the exposed portions of the substrate 101 are recessed. An anisotropic etch may be performed to remove the portions of the liner 120 formed on horizontal surfaces of the semiconductor device structure 100, such as on the nitrogen-containing layer 114 and on the substrate 101. The portions of the liner 120 formed on the side surfaces of the fin 102 are not substantially affected. Next, the exposed portions of the substrate 101 are recessed by any suitable process, such as dry etch, wet etch, or a combination thereof. The recess process may be a selective process that does not substantially affect the liner 120 and the nitrogen-containing layer 114.

As shown in FIG. 2D, the fin 102 includes a first portion 122 and a second portion 124 located over the first portion 122. In some embodiments, the first portion 122 and the second portion 124 together is the substrate portion 103. The first portion 122 has a width W1 substantially greater than a width W2 of the second portion 124. By recessing the substrate 101, the doped regions formed in the substrate 101 are separated. In some embodiments, the first portion 122 of the fin 102 includes a doped region that is separated from a doped region in the first portion 122 of an adjacent fin 102. The recess of the substrate 101 increases the height of the fin 102 from H2 to H1. The increased height H1 may help with isolation of the doped regions as the device size is getting smaller. The height H1 may be from the bottom of the fin 102 to the top surface of the top-most first semiconductor layer 106, and the height H2 may be from the bottom of the second portion 124 to the top surface of the top-most first semiconductor layer 106. In some embodiments, the height H1 may range from about 130 nm to about 300 nm, and the second height H2 may range from about 100 nm to about 200 nm. In addition, as the device size decreases, fin width of the fin 102 also decreases. Thus, the width W2 of the second portion 124 may range from about 5 nm to about 10 nm. If the fin 102 has a substantially constant width W2, the aspect ratio may range from about 13 to about 60. With such high aspect ratio, the fins 102 may collapse during subsequent processes. In order to prevent the fins 102 from collapsing during subsequent processes, the liner 120 is formed on the side surfaces of the second portion 124 of the fin 102, and the first portion 122 of the fin 102 has the width W1 substantially greater than the width W2 of the second portion 124. Thus, the width W2 of the second portion 124 of the fin 102 decreases the size of the devices, while the liner 120 and the width W1 of the first portion 122 reduce the chance of collapsing of the fins 102. In some embodiments, the width W1 ranges from about 7 nm to about 20 nm, and the difference between the width W1 and the width W2 is at least 2 nm. If the difference is less than 2 nm, the fin 102 may collapse due to the large aspect ratio. Similarly, in some embodiments, the difference between the height H1 and the height H2 is at least 20 nm. If the difference is less than 20 nm, the fin 102 may collapse due to the large aspect ratio of the portion of the fin 102 having the height H2.

As shown in FIG. 2E, an insulating material 126 is formed on the substrate 101 and the liner 120. The insulating material 126 fills the trench 118 (FIG. 2D). The insulating material 126 may be first formed over the fins 102 so that the fins 102 are embedded in the insulating material 126. Then, a planarization operation, such as a chemical mechanical polishing (CMP) process and/or an etch-back process, is performed such that the tops of the nitrogen-containing layer 114 are exposed from the insulating material 126, as shown in FIG. 2E. The insulating material 126 may be made of an oxygen-containing material, such as silicon oxide or fluorine-doped silicate glass (FSG); a nitrogen-containing material, such as silicon nitride, silicon oxynitride (SiON), SiOCN, SiCN; a low-K dielectric material; or any suitable dielectric material. In some embodiments, the insulating material 126 may include the same material as the liner 120. The insulating material 126 may be formed by any suitable method, such as low-pressure chemical vapor deposition (LPCVD), plasma enhanced CVD (PECVD) or flowable CVD (FCVD).

As shown in FIG. 2F, the insulating material 126 and liner 120 may be recessed by removing a portion of the insulating material 126 and a portion of the liner 120 located between adjacent fins 102 to form trenches 128. The trenches 128 may be formed by any suitable removal process, such as dry etch or wet etch that selectively removes the insulating material 126 and the liner 120 but not the semiconductor materials of the stack of semiconductor layers 104. The recess process may also remove the mask structure 110 and the cap layer 109 to expose the top surface of the top-most first semiconductor layer 106. The recessed insulating material 126 may be the shallow trench isolation (STI). A sacrificial gate dielectric layer 130 is then formed on the insulating material 126, the liner 120, and the stacks of the semiconductor layers 104. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, a sub-atmospheric CVD (SACVD) process, a FCVD process, an ALD process, a PVD process, or other suitable process.

As shown in FIG. 2F, the substrate portion 103, which is the portion of the substrate 101 from the bottom of the fin 102 to a top surface of the substrate 101 in contact with a bottom surface of the bottom-most second semiconductor layer 108, includes a non-planar surface 131 having a first surface 132, a second surface 134, and a third surface 136 connecting the first surface 132 and the second surface 134. In some embodiments, the first portion 122 may include opposite surfaces 132, and the second portion 124 may include opposite surfaces 134. The first surface 132 and the third surface 136 may form an angle A1, and the second surface 134 and the third surface 136 may form an angle A2. In some embodiments, both angles A1 and A2 are greater than or equal to about 90 degrees, for example from about 90 degrees to about 130 degrees. In some embodiments, the angle A1 is substantially the same as the angle A2. In some embodiments, the angle A1 is substantially different from the angle A2.

Figure 2G:
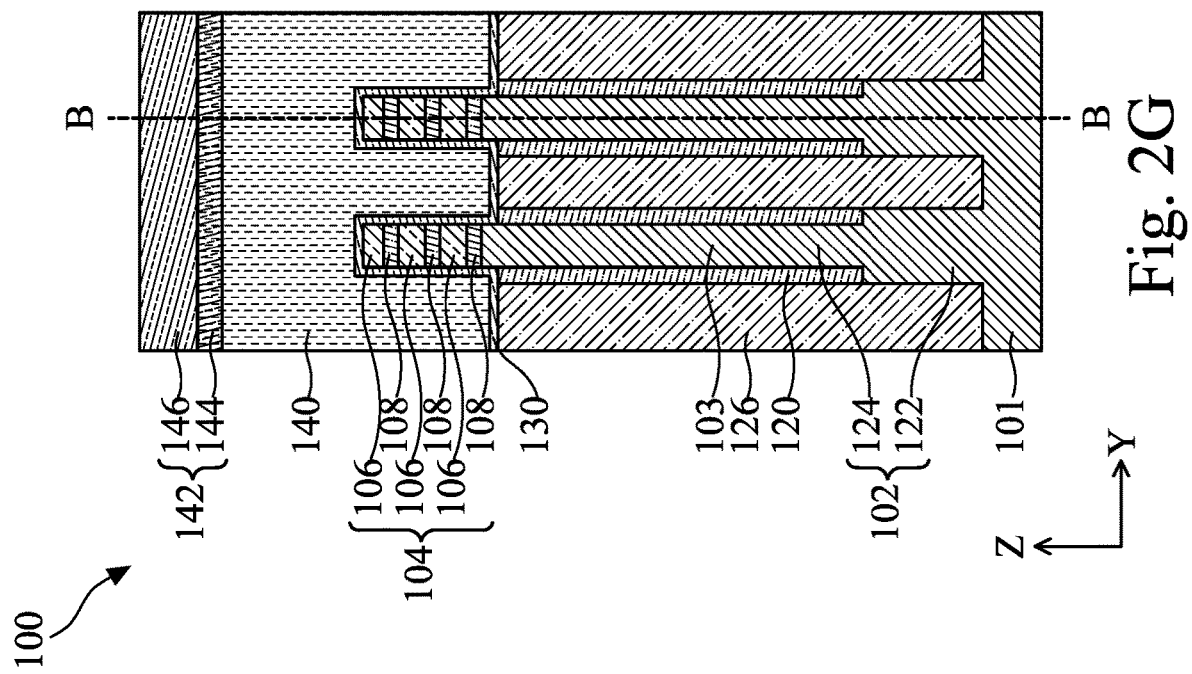

As shown in FIG. 2G, a sacrificial gate electrode layer 140 and a mask structure 142 are formed on the sacrificial gate dielectric layer 130. The sacrificial gate electrode layer 140 may include polycrystalline silicon (polysilicon). The mask structure 142 may include an oxygen-containing layer 144 and a nitrogen-containing layer 146. In some embodiments, the sacrificial gate electrode layer 140 and the mask structure 142 are formed by various processes such as layer deposition, for example, CVD (including both LPCVD and PECVD), PVD, ALD, thermal oxidation, e-beam evaporation, or other suitable deposition techniques, or combinations thereof.

Figure 3A:
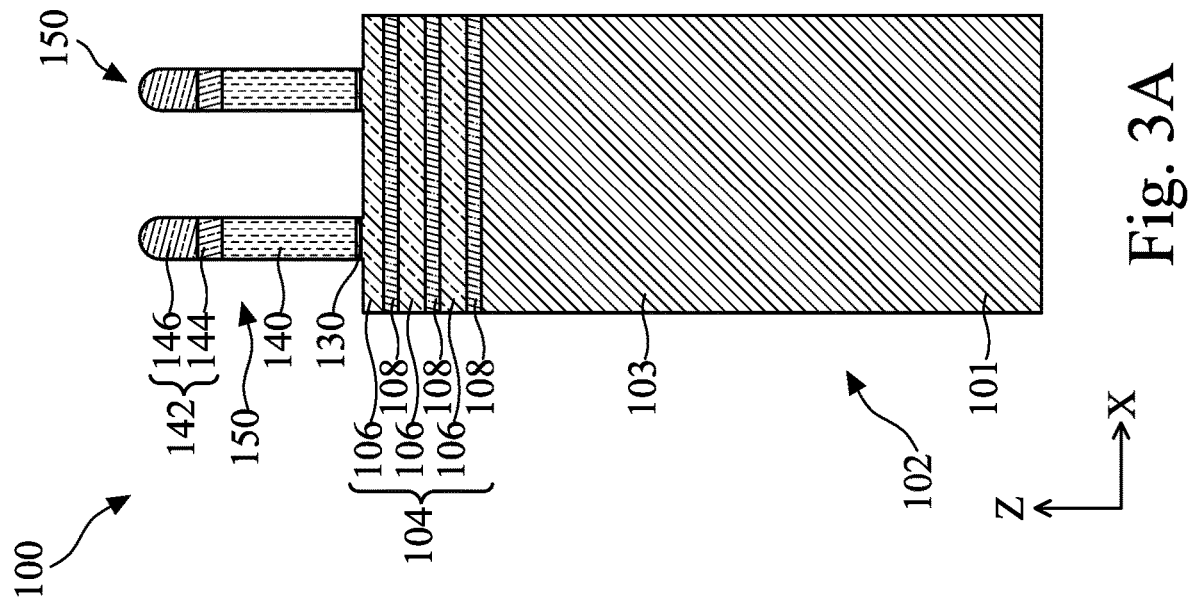

FIGS. 3A-3I are cross-sectional side views of various stages of manufacturing the semiconductor device structure 100 taken along line B-B of FIG. 2G, in accordance with some embodiments. As shown in FIG. 3A, one or more sacrificial gate stacks 150 are formed on a portion of the fins 102. The sacrificial gate stack 150 may include the sacrificial gate dielectric layer 130, the sacrificial gate electrode layer 140, and the mask structure 142. The sacrificial gate stacks 150 may be formed by patterning and etching the sacrificial gate dielectric layer 130, the sacrificial gate electrode layer 140, and the mask structure 142. For example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etch (e.g., RIE), wet etch, other etch methods, and/or combinations thereof. By patterning the sacrificial gate stack 150, the stacks of semiconductor layers 104 of the fins 102 are partially exposed on opposite sides of the sacrificial gate stack 150. As shown in FIG. 3A, two sacrificial gate stacks 150 are formed, but the number of the sacrificial gate stacks 150 is not limited to two. More than two sacrificial gate stacks 150 are arranged along the X direction in some embodiments.

As shown in FIG. 3B, a spacer 152 is formed on the sidewalls of the sacrificial gate stacks 150. The spacer 152 may be formed by first depositing a conformal layer that is subsequently etched back to form sidewall spacers 152. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 102 and the tops of the sacrificial gate stacks 150, leaving the spacers 152 on the vertical surfaces, such as the sidewalls of sacrificial gate stack 150. The spacer 152 may be made of a dielectric material such as silicon oxide, silicon nitride, silicon carbide, silicon oxynitride, SiCN, silicon oxycarbide, SiOCN, and/or combinations thereof. In some embodiments, the spacer 152 includes multiple layers, such as main spacer walls, liner layers, and the like.

As shown in FIG. 3C, exposed portions of the fins 102 not covered by the sacrificial gate stacks 150 and the spacers 152 are recessed by one or more suitable etch processes, such as dry etch, wet etch, or a combination thereof. In some embodiments, exposed portions of the stacks of semiconductor layers 104 of the fins 102 are removed, exposing portions of the substrate portion 103. In some embodiments, a portion of the substrate portion 103 may be also removed. At this stage, end portions of the stacks of semiconductor layers 104 under the sacrificial gate stacks 150 and the spacers 152 have substantially flat surfaces which may be flush with corresponding spacers 152. In some embodiments, the end portions of the stacks of semiconductor layers 104 under the sacrificial gate stacks 150 and spacers 152 are slightly horizontally etched.

As shown in FIG. 3D, the edge portions of each second semiconductor layer 108 are removed, and dielectric spacers 154 are formed in the space created by the removal of the edge portions of the second semiconductor layers 108. In some embodiments, the portions of the second semiconductor layers 108 are removed by a selective wet etch process that does not remove the first semiconductor layers 106. For example, in cases where the second semiconductor layers 108 are made of SiGe, and the first semiconductor layers 106 are made of silicon, a selective wet etch including an ammonia and hydrogen peroxide mixtures (APM) may be used. In some embodiments, the dielectric spacers 154 may be made of SiON, SiCN, SiOC, SiOCN, or SiN. In some embodiments, the dielectric spacers 154 may be formed by first forming a conformal dielectric layer using a conformal deposition process, such as ALD, followed by an anisotropic etch to remove portions of the conformal dielectric layer other than the dielectric spacers 154. The dielectric spacers 154 may be protected by the first semiconductor layers 106 during the anisotropic etch process. In some embodiments, the dielectric spacers 154 may be flush with the spacers 152.

As shown in FIG. 3E, S/D epitaxial features 156 are formed on the substrate portions 103 of the fins 102. The S/D epitaxial feature 156 may include one or more layers of Si, SiP, SiC and SiCP for an n-channel FET or Si, SiGe, Ge for a p-channel FET. The S/D epitaxial features 156 may grow both vertically and horizontally to form facets, which may correspond to crystalline planes of the material used for the substrate portions 103. The S/D epitaxial features 156 are formed by an epitaxial growth method using CVD, ALD or MBE. As shown in FIG. 3E, the S/D epitaxial features 156 are in contact with the first semiconductor layers 106 and the dielectric spacers 154. The S/D epitaxial features 156 may be the S/D regions. For example, one of a pair of S/D epitaxial features 156 located on one side of the stack of semiconductor layers 104 is a source region, and the other of the pair of S/D epitaxial features 156 located on the other side of the stack of semiconductor layers 104 is a drain region. A pair of S/D epitaxial features 156 is referring to a source epitaxial feature 156 and a drain epitaxial feature 156 connected by the channels (i.e., the first semiconductor layers 106). In this disclosure, a source and a drain are interchangeably used, and the structures thereof are substantially the same.

As shown in FIG. 3F, a contact etch stop layer (CESL) 158 may be formed on the S/D epitaxial features 156 and the sacrificial gate stacks 150. The CESL 158 may include an oxygen-containing material or a nitrogen-containing material, such as silicon nitride, silicon carbon nitride, silicon oxynitride, carbon nitride, silicon oxide, silicon carbon oxide, or the like, or a combination thereof. The CESL 158 may be formed by CVD, PECVD, ALD, or any suitable deposition technique. In some embodiments, the CESL 158 is a conformal layer formed by the ALD process. An interlayer dielectric (ILD) layer 160 may be formed on the CESL 158. The materials for the ILD layer 160 may include oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 160 may be deposited by a PECVD process or other suitable deposition technique. In some embodiments, after formation of the ILD layer 160, the semiconductor device structure 100 may be subject to a thermal process to anneal the ILD layer 160.

A planarization process is performed to expose the sacrificial gate electrode layer 140, as shown in FIG. 3F. The planarization process may be any suitable process, such as a CMP process. The planarization process removes portions of the ILD layer 160 and the CESL 158 disposed on the sacrificial gate stacks 150. The planarization process may also remove the mask structure 142 (FIG. 3E).

As shown in FIG. 3G, after the formation of the CESL 158 and the ILD layer 160, the sacrificial gate electrode layers 140 and the sacrificial gate dielectric layers 130 are removed. The sacrificial gate electrode layers 140 may be removed by any suitable process, such as dry etch, wet etch, or a combination thereof. In some embodiments, a wet etchant such as a tetramethylammonium hydroxide (TMAH) solution can be used to selectively remove the sacrificial gate electrode layer 140 but not ILD layer 160 and the CESL 158. Next, the second semiconductor layers 108 are removed. The removal process exposes the dielectric spacers 154 and the first semiconductor layers 106, as shown in FIG. 3G. The removal process may be any suitable processes, such as dry etch, wet etch, or a combination thereof. The etch process may be a selective etch process that does not substantially affect the spacer 152 and the ILD layer 160. As a result, openings 166 are formed in the channel regions of the semiconductor device structure 100, as shown in FIG. 3G. The first semiconductor layers 106 may be exposed in the openings 166. Each first semiconductor layer 106 may be a nanostructure channel of the nanosheet transistor.

As shown in FIG. 3H, after the formation of the openings 166, an oxygen-containing layer 168 may be formed around the exposed surfaces of the first semiconductor layer 106 and the substrate portions 103 in the openings 166, followed by forming a gate dielectric layer 170 on the oxygen-containing layer 168 and the spacers 152, and then forming a gate electrode layer 172 on the gate dielectric layer 170. The oxygen-containing layer 168 may be an oxide layer, and the gate dielectric layer 170 may include a material having a K value greater than that of silicon oxide, such as $HfO_2$, $ZrO_2$, $HfAlO_x$, $HfSiO_x$, or $Al_2O_3$. In some embodiments, the gate dielectric layer 170 includes a material having a K value greater than 7. The oxygen-containing layer 168 and the gate dielectric layer 170 may be formed by any suitable processes, such as ALD processes. In some embodiments, the oxygen-containing layer 168 and the gate dielectric layer 170 are formed by conformal processes.

The gate electrode layer 172 is formed on the gate dielectric layer 170 to surround a portion of each first semiconductor layer 106. The gate electrode layer 172 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 172 may be formed by PVD, CVD, ALD, electro-plating, or other suitable method. The gate electrode layer 172 may be also deposited over the ILD layer 160. The gate electrode layer 172 formed over the ILD layer 160 may be removed by using, for example, CMP, until the ILD layer 160 is exposed.

The gate electrode layer 172 and the gate dielectric layer 170 may be recessed to a level below a top surface of the ILD layer 160, as shown in FIG. 3I. The recess process may be any suitable process, such as a dry etch, a wet etch, or a combination thereof. In some embodiments, the spacer 152 may be recessed. As shown in FIG. 3I, a dielectric material 174 is formed over the gate electrode layer 172 and the gate dielectric layer 170. The dielectric material 174 may include SiO, HfSi, SiOC, AlO, ZrSi, AlON, ZrO, HfO, TiO, ZrAlO, ZnO, TaO, LaO, YO, TaCN, SiN, SiOCN, ZrN, or SiCN. The dielectric material 174 may be formed by any suitable process, such as PECVD.

Figure 4:
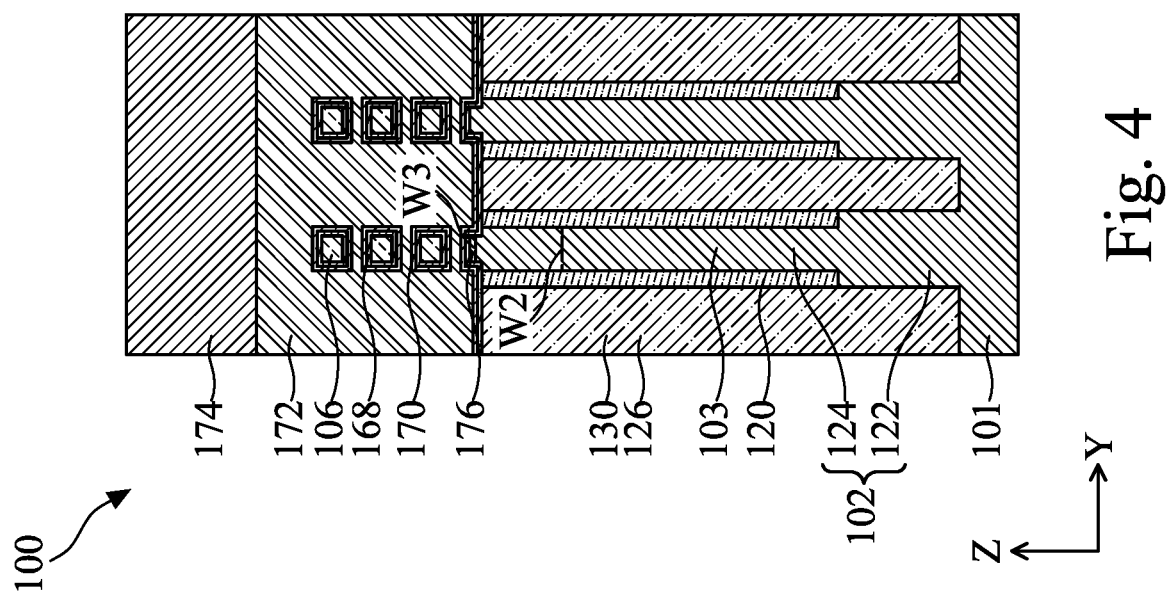
FIG. 4 is a cross-sectional side view of one of various stages of manufacturing the semiconductor device structure taken along line C-C of FIG. 3I, in accordance with some embodiments.

FIG. 4 is a cross-sectional side view of one of various stages of manufacturing the semiconductor device structure 100 taken along line C-C of FIG. 3I, in accordance with some embodiments. As shown in FIG. 4, the second portion 124 of the fin 102 includes a top portion 176 having a width W3. The width W3 of the top portion 176 may be initially the same as the width W2 of the second portion 124, and the width W3 may be reduced during the removal of the second semiconductor layers 108. Thus, the width W3 of the top portion 176 of the second portion 124 may be substantially less than the width W2 of the second portion 124.

Figure 5A:
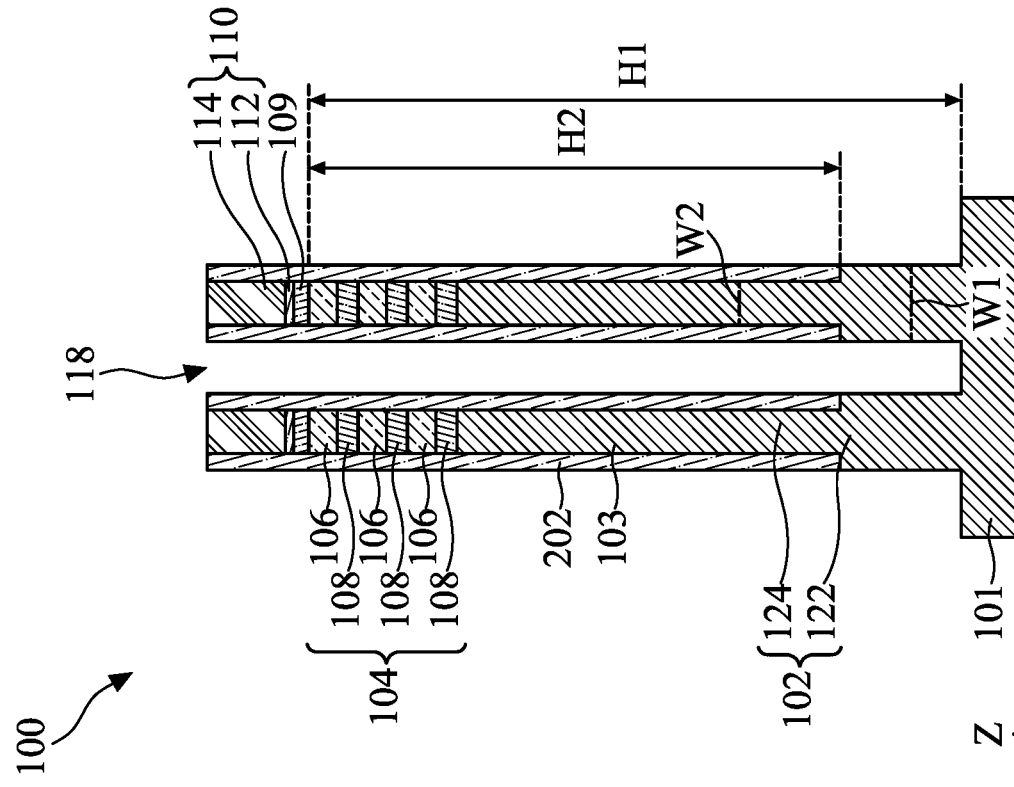

FIGS. 5A-5F are cross-sectional side views of various stages of manufacturing the semiconductor device structure 100 taken along line A-A of FIG. 1, in accordance with alternative embodiments. As shown in FIG. 5A, after the formation of the fins 102 shown in FIG. 2B, a liner 202 is formed on the substrate 101 and the fins 102. Unlike the liner 120, the liner 202 may include a semiconductor material, such as silicon. The liner 202 may be a conformal layer formed by a conformal process, such as ALD. The liner 202 may have a thickness ranging from about 1 nm to about 5 nm.

Figure 5B:
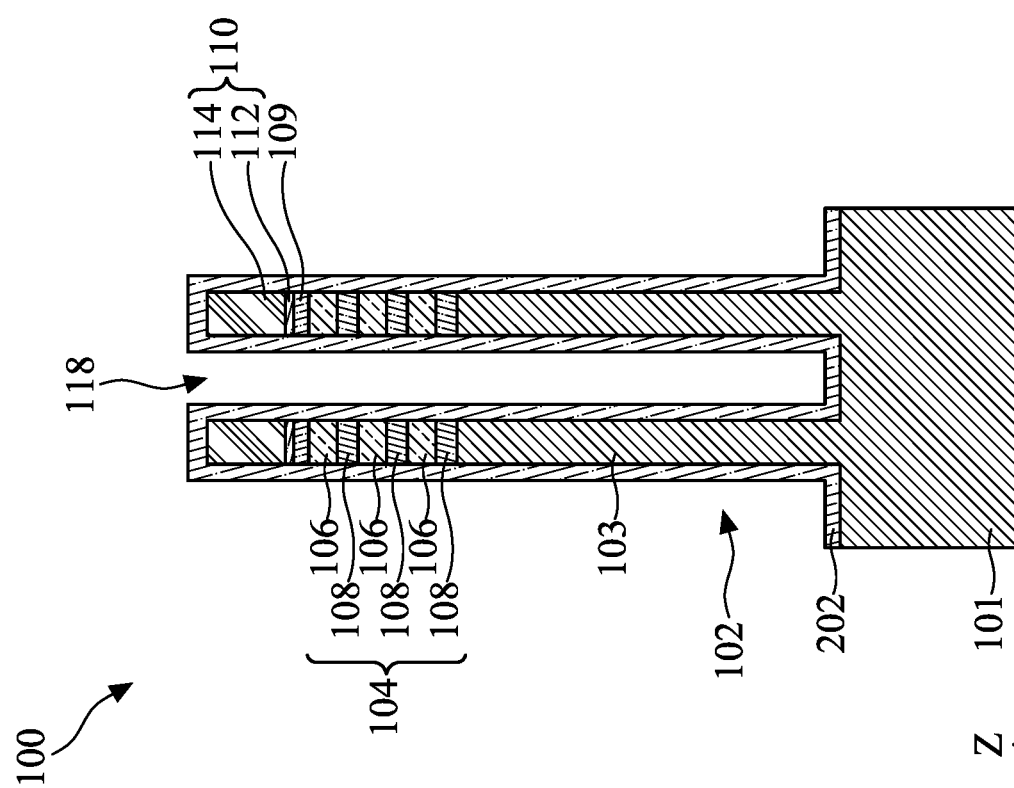

As shown in FIG. 5B, portions of the liner 202 formed on horizontal surfaces are removed to expose portions of the substrate 101, and the exposed portions of the substrate 101 are recessed. An anisotropic etch may be performed to remove the portions of the liner 202 formed on horizontal surfaces of the semiconductor device structure 100, such as on the nitrogen-containing layer 114 and on the substrate 101. The portions of the liner 202 formed on the side surfaces of the fin 102 are not substantially affected. In some embodiments, the same anisotropic etch process also recesses the exposed portions of the substrate 101. The recess of the substrate 101 increases the height of the fin 102 from H2 to H1, as described above. The substrate portion 103 may include the first portion 122 and the second portion 124, and the first portion 122 has the width W1 substantially greater than the width W2 of the second portion 124. Similar to the liner 120, the liner 202 is formed on the side surfaces of the second portion 124 of the fin 102 to prevent the fins 102 from collapsing.

As shown in FIG. 5C, the insulating material 126 is formed on the substrate 101 and the liner 202. As shown in FIG. 5D, the insulating material 126 may be recessed by removing a portion of the insulating material 126 located between adjacent fins 102 to form trenches 128. Portions of the liner 202 are exposed. The trenches 128 may be formed by any suitable removal process, such as dry etch or wet etch that selectively removes the insulating material 126 but not the semiconductor materials of the stack of semiconductor layers 104 and the liner 202. The recess process may also remove the mask structure 110 to expose the top surface of the cap layer 109.

Figure 5F:
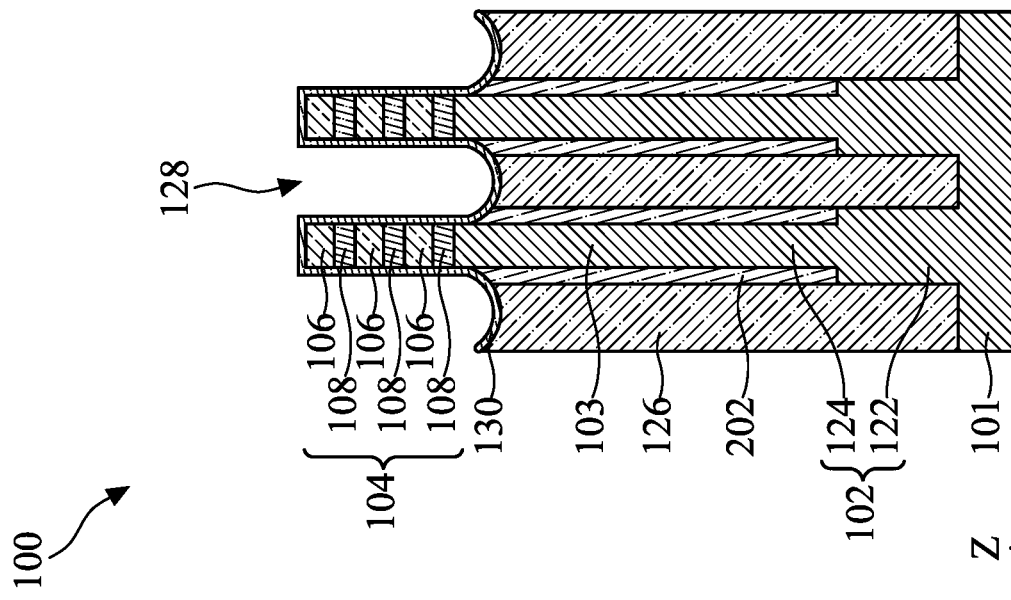
Figure 5E:
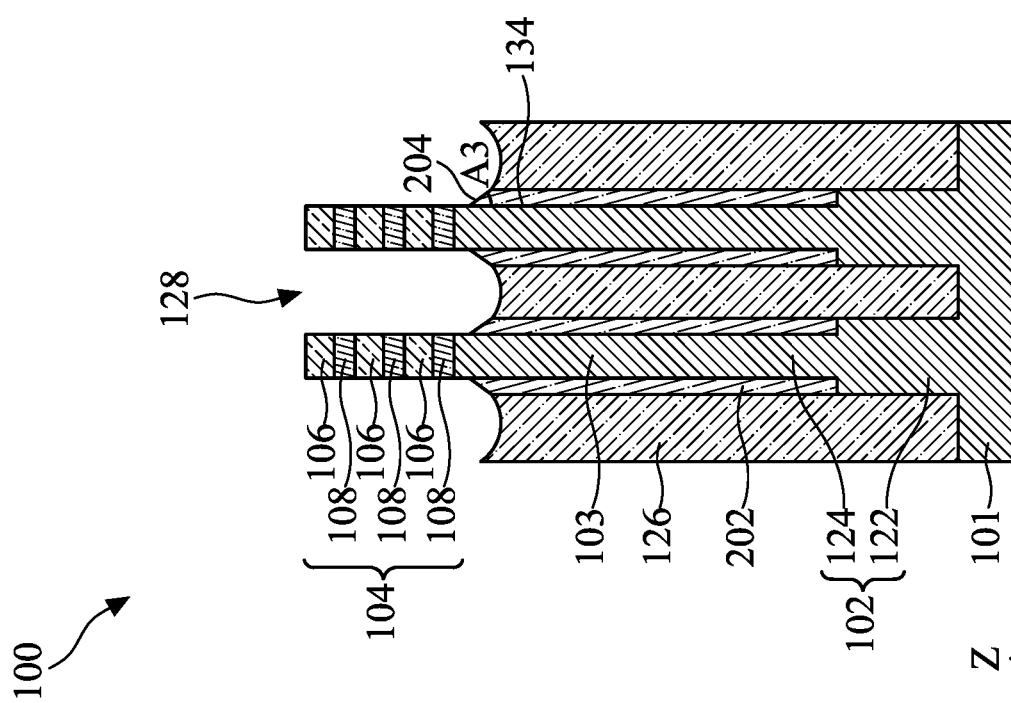

As shown in FIG. 5E, after recessing the insulating material 126, the exposed portions of the liner 202 are removed. The removal of the exposed portions of the liner 202 may be performed by an oxidation process followed by an etch process. For example, a portion of the exposed portion of the liner 202 is oxidized, and an etch process selectively remove the oxidized liner 202 but not the semiconductor materials of the stack of semiconductor layers 104. The oxidation process may be controlled to oxidize a portion of the exposed portion of the liner 202 to avoid oxidizing the stack of semiconductor layers 104. The cap layer 109 may be oxidized and removed by the oxidation and etch processes in order to protect the top-most first semiconductor layer 106. The oxidization/etch processes may be repeated until the exposed portions of the liner 202 are removed. The cap layer 109 may be also removed by the cyclic oxidation/etch processes. Because the etch process removes oxide, the insulation material 126 may be recessed, in some embodiments. Because of the oxidation/etch processes, the top surface 204 of the liner 202 may be slanted. In some embodiments, the top surface 204 may form an angle A3 with respect to the second surface 134 of the fin 102, and the angle A3 may be an acute angle, such as from about 10 degrees to about 80 degrees. The removal of the exposed portions of the liner 202 exposes the stack of semiconductor layers 104.

The sacrificial gate dielectric layer 130 is then formed on the insulating material 126 and the stacks of the semiconductor layers 104, as shown in FIG. 5F.

FIGS. 6A-6C are cross-sectional side views of various stages of manufacturing the semiconductor device structure 100 taken along line B-B of FIG. 2G, in accordance with some embodiments. As shown in FIG. 6A, the sacrificial gate stacks 150 are formed on a portion of the fins 102, and the spacers 152 are formed on the sidewalls of the sacrificial gate stacks 150.

As shown in FIG. 6B, exposed portions of the fins 102 not covered by the sacrificial gate stacks 150 and the spacers 152 are recessed, the edge portions of each second semiconductor layer 108 are removed, dielectric spacers 154 are formed in the space created by the removal of the edge portions of the second semiconductor layers 108, and S/D epitaxial features 156 are formed on the substrate portions 103 of the fins 102. As shown in FIG. 6C, the CESL 158 and the ILD layer 160 may be formed, and the sacrificial gate stacks 150 are replaced with the oxygen-containing layer 168, the gate dielectric layer 170, and the gate electrode layer 172. The dielectric material 174 is then formed over the gate electrode layer 172 and the gate dielectric layer 170.

FIG. 7 is a cross-sectional side view of one of various stages of manufacturing the semiconductor device structure 100 taken along line C-C of FIG. 3I, in accordance with alternative embodiments. As shown in FIG. 7, the second portion 124 of the fin 102 includes the top portion 176 having the width W3 substantially less than the width W2 of the second portion 124 of the fin 102. In some embodiments, the liner 202 formed on the side surfaces of the second portion 124 of the fin 102 may have an outer surface 206 substantially co-planar with the first surface 132 of the first portion 122 of the fin 102. Thus, in some embodiments, a semiconductor structure 208 includes the semiconductor fin 102 and two liners 202 disposed on the second portion 124 of the fin 102. The semiconductor structure 208 has substantially co-planar outer surfaces 132, 206. The semiconductor structure 208 includes the first portion 122 that is monolithic and a second portion having the second portion 124 of the fin 102 and two liners 202 formed on opposite second surfaces 134 of the second portion 124 of the fin 102. In some embodiments, the semiconductor structure 208 may have a constant width W1. The semiconductor structure 208 may improve the isolation of the doped regions and prevent the fins 102 from collapsing.

Figure 8D:
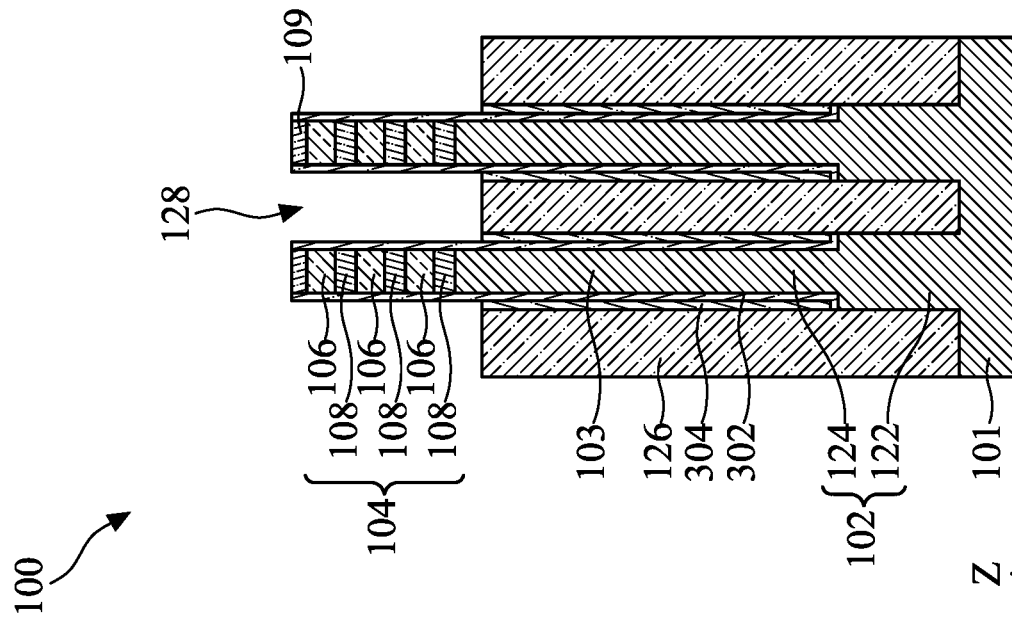

FIGS. 8A-8F are cross-sectional side views of various stages of manufacturing the semiconductor device structure 100 taken along line A-A of FIG. 1, in accordance with alternative embodiments. As shown in FIG. 8A, after the formation of the fins 102 shown in FIG. 2B, a first liner 302 is formed on the substrate 101 and the fins 102, and a second liner 304 is formed on the first liner 302. The first liner 302 may include the same material as the liner 202, and the second liner 304 may include the same material as the liner 120. The first liner 302 and the second liner 304 may be conformal layers and formed by conformal processes, such as ALD. In some embodiments, the thickness of the first liner 302 may be less than the thickness of the liner 202. For example, the first liner 302 may have a thickness ranging from about 1 nm to about 3 nm. In some embodiments, the total thickness of the first liner 302 and the second liner 304 equals the thickness of the liner 202.

As shown in FIG. 8B, portions of the first and second liners 302, 304 formed on horizontal surfaces are removed to expose portions of the substrate 101, and the exposed portions of the substrate 101 are recessed. A first anisotropic etch may be performed to remove the portions of the second liner 304, and a second anisotropic etch may be performed to remove the portions of the first liner 302 and to recess the exposed portions of the substrate 101. The recess of the substrate 101 increases the height of the fin 102 from H2 to H1, as described above. The substrate portion 103 may include the first portion 122 and the second portion 124, and the first portion 122 has the width W1 substantially greater than the width W2 of the second portion 124. Similar to the liner 120 and the liner 202, the first liner 302 and the second liner 304 are formed on the side surfaces of the second portion 124 of the fin 102 to prevent the fins 102 from collapsing.

Figure 8C:
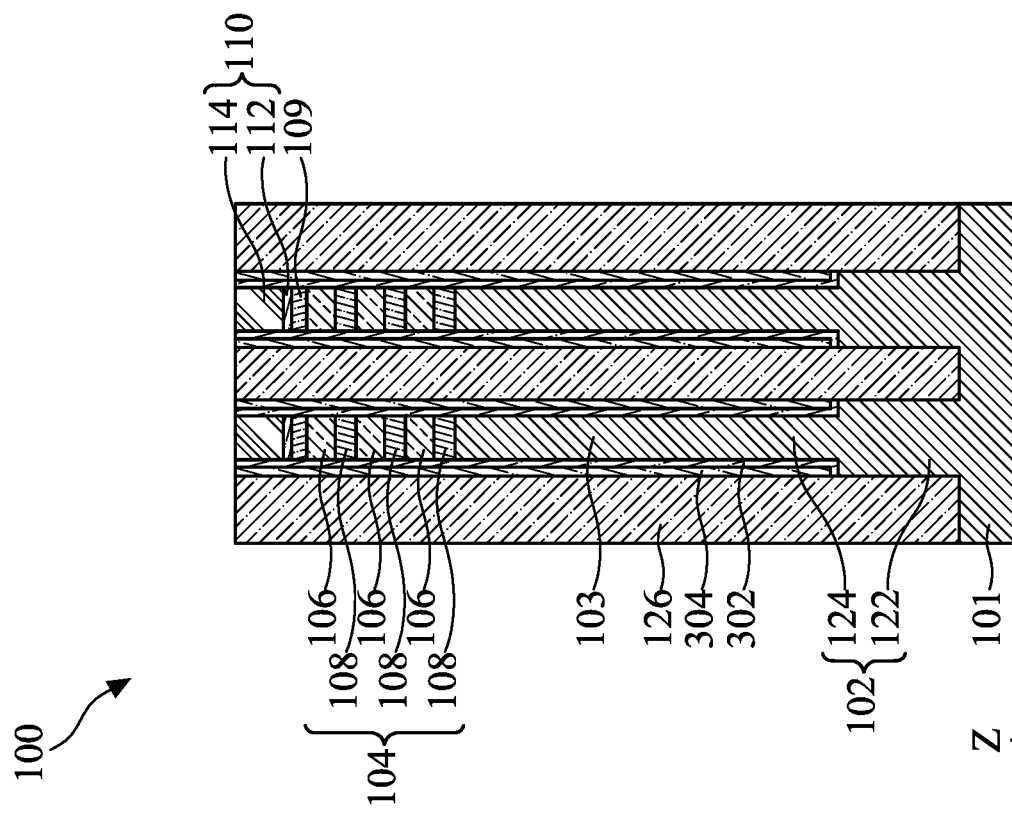

As shown in FIG. 8C, the insulating material 126 is formed on the substrate 101 and the second liner 304. As shown in FIG. 8D, the insulating material 126 and the second liner 304 may be recessed by removing a portion of the insulating material 126 and the second liner 304 located between adjacent fins 102 to form trenches 128. Portions of the first liner 302 are exposed. The recess process may also remove the mask structure 110 to expose the top surface of the cap layer 109.

Figure 8F:
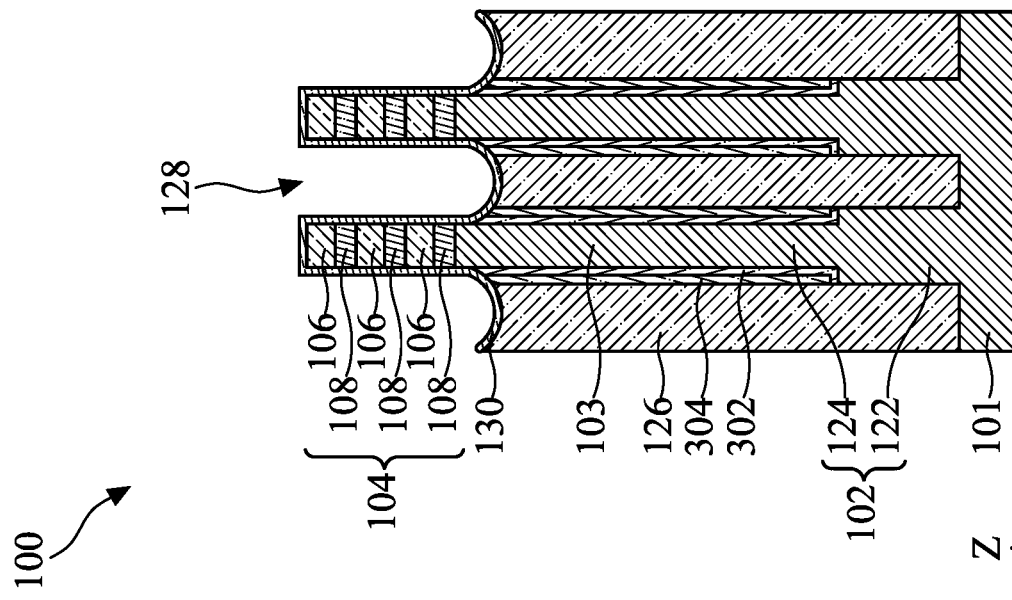
Figure 8E:
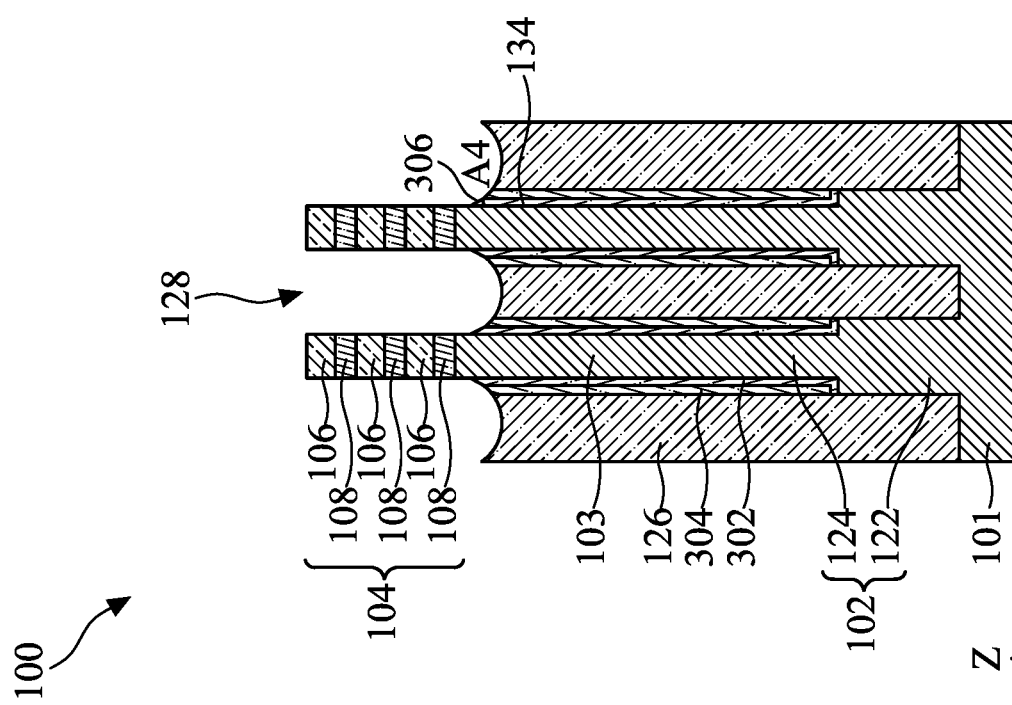

As shown in FIG. 8E, after recessing the insulating material 126, the exposed portions of the first liner 302 are removed. The removal of the exposed portions of the first liner 302 may be performed by the same oxidation/etch processes as for the removal of the portions of the liner 202. However, because the first liner 302 is thinner than the liner 202, the exposed portions of the first liner 302 may be easier to remove compared to the liner 202. In some embodiments, the top surface 306 may form an angle A4 with respect to the second surface 134 of the fin 102, and the angle A4 may be an acute angle, such as from about 10 degrees to about 80 degrees. The removal of the exposed portions of the first liner 302 exposes the stack of semiconductor layers 104.

The sacrificial gate dielectric layer 130 is then formed on the insulating material 126 and the stacks of the semiconductor layers 104, as shown in FIG. 8F.

Figure 9C:
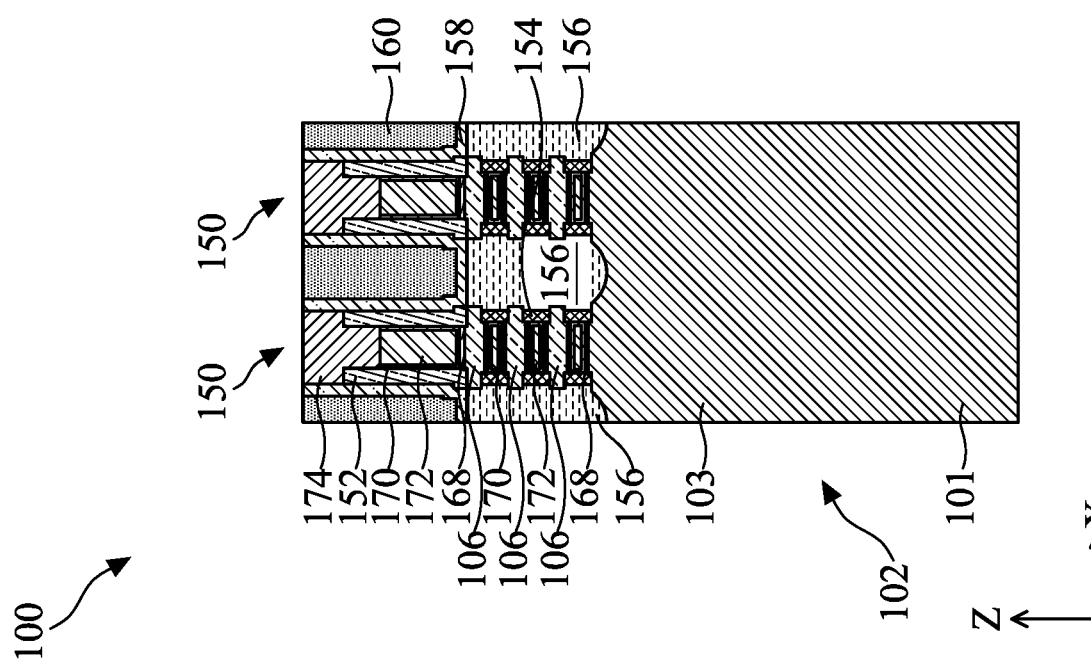

FIGS. 9A-9C are cross-sectional side views of various stages of manufacturing the semiconductor device structure 100 taken along line B-B of FIG. 2G, in accordance with alternative embodiments. As shown in FIG. 9A, the sacrificial gate stacks 150 are formed on a portion of the fins 102, and the spacers 152 are formed on the sidewalls of the sacrificial gate stacks 150.

As shown in FIG. 9B, exposed portions of the fins 102 not covered by the sacrificial gate stacks 150 and the spacers 152 are recessed, the edge portions of each second semiconductor layer 108 are removed, dielectric spacers 154 are formed in the space created by the removal of the edge portions of the second semiconductor layers 108, and S/D epitaxial features 156 are formed on the substrate portions 103 of the fins 102. As shown in FIG. 9C, the CESL 158 and the ILD layer 160 may be formed, and the sacrificial gate stacks 150 are replaced with the oxygen-containing layer 168, the gate dielectric layer 170, and the gate electrode layer 172. The dielectric material 174 is then formed over the gate electrode layer 172 and the gate dielectric layer 170.

Figure 10:
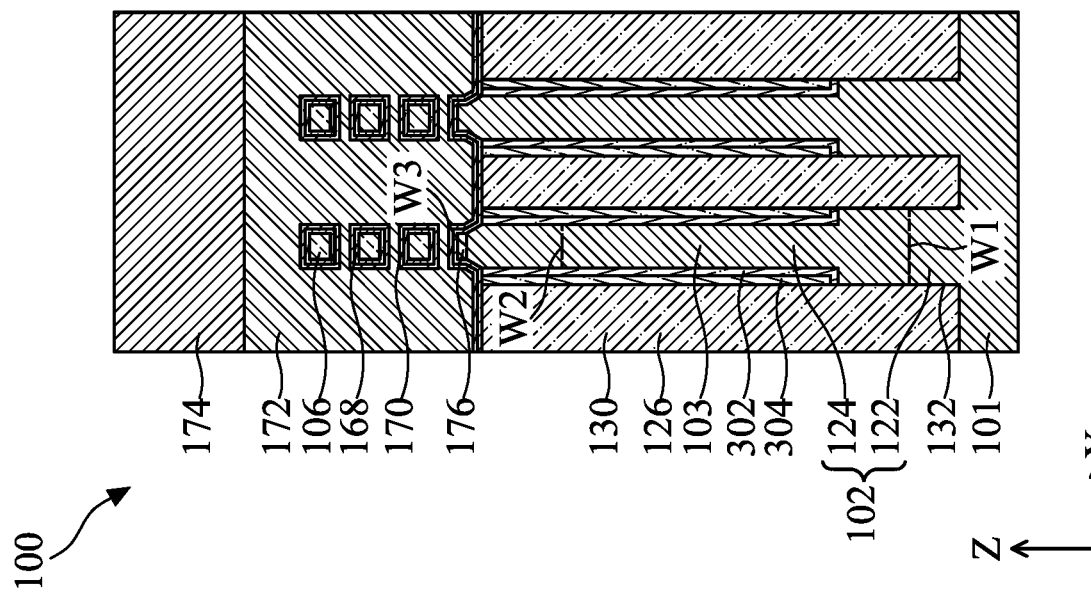
FIG. 10 is a cross-sectional side view of one of various stages of manufacturing the semiconductor device structure taken along line C-C of FIG. 3I, in accordance with alternative embodiments.

FIG. 10 is a cross-sectional side view of one of various stages of manufacturing the semiconductor device structure taken along line C-C of FIG. 3I, in accordance with alternative embodiments. As shown in FIG. 10, the second portion 124 of the fin 102 includes the top portion 176 having the width W3 substantially less than the width W2 of the second portion 124 of the fin 102. In some embodiments, the width W2 of the second portion 124 plus the thicknesses of the two first liners 302 formed on the side surfaces of the second portion 124 is still less than the width W1 of the first portion 122 of the fin 102.

Embodiments of the present disclosure provide a semiconductor device structure 100 including one or more fins 102 formed by a two-step process. The fin 102 includes the first portion 122 having the first width W1 and the second portion 124 having the second width less than the second width W2. Liners 120 (or liners 202, 302, 304) may be formed on opposite side surfaces of the second portion 124. Some embodiments may achieve advantages. For example, the first width W1 and the liners 120 (or liners 202, 302, 304) may prevent the fins 102 from collapsing during subsequent processes. Furthermore, the fin 102 has an extended height H1, so the doped regions are separated.

An embodiment is a semiconductor device structure. The semiconductor device structure includes a semiconductor fin having a first portion having a first width and a second portion having a second width substantially less than the first width. The first portion has a first surface, the second portion has a second surface, and the first and second surfaces are connected by a third surface. The third surface forms an angle with respect to the second surface, and the angle ranges from about 90 degrees to about 130 degrees. The structure further includes a gate electrode layer disposed over the semiconductor fin and source/drain epitaxial features disposed on the semiconductor fin on opposite sides of the gate electrode layer.

Another embodiment is a semiconductor device structure. The semiconductor device structure includes a semiconductor structure comprising a semiconductor fin and two liners disposed on opposite side surfaces of a first portion of the semiconductor fin. The first portion of the semiconductor fin and the two liners together has a first width, and a second portion of the semiconductor fin has a second width substantially the same as first width. The structure further includes a gate electrode layer disposed over the semiconductor fin and source/drain epitaxial features disposed on the semiconductor fin and on opposite sides of the gate electrode layer.

A further embodiment is a method. The method includes forming a semiconductor fin from a substrate, forming a first liner on the semiconductor fin, removing portions of the first liner to expose a portion of the substrate, recessing the substrate to extend a height of the semiconductor fin, forming a sacrificial gate stack over a portion of the semiconductor fin, forming source/drain epitaxial features from the semiconductor fin, removing the sacrificial gate stack, and forming a gate electrode layer over the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a semiconductor fin from a substrate;
   forming a first liner on the semiconductor fin;
   removing portions of the first liner to expose a portion of the substrate;
   recessing the substrate to extend a height of the semiconductor fin;
   forming a sacrificial gate stack over a portion of the semiconductor fin;
   forming source/drain epitaxial features from the semiconductor fin;
   removing the sacrificial gate stack; and
   forming a gate electrode layer over the semiconductor fin.

2. The method of claim 1, further comprising forming an insulating material around the semiconductor fin.

3. The method of claim 2, further comprising recessing the insulating material and the first liner.

4. The method of claim 3, further comprising forming a second liner on the first liner before forming the insulating material.

5. The method of claim 4, further comprising recessing the second liner, wherein the first liner is recessed after recessing the second liner.

6. The method of claim 5, wherein the first and the second liners comprise different materials.

7. The method of claim 6, wherein the first liner comprises the same material as the insulating material.

8. A method, comprising:
   forming first and second semiconductor fins from a substrate, each of the first and second semiconductor fins has a first height, wherein an opening is formed between the first and second semiconductor fins;
   depositing a first liner surrounding the first and second semiconductor fin;
   removing portions of the first liner to expose portions of the substrate;
   recessing the substrate to extend the first height of the first and second semiconductor fins; and
   forming a sacrificial gate stack over a portion of each of the first and second semiconductor fins.

9. The method of claim 8, further comprising depositing a second liner on the first liner prior to removing portions of the first liner.

10. The method of claim 9, further comprising removing portions of the second liner to expose the portions of the first liner to be removed.

11. The method of claim 9, further comprising depositing an insulating material around the first and second semiconductor fins.

12. The method of claim 11, further comprising recessing the insulating material and the second liner by a first process.

13. The method of claim 12, further comprising recessing the first liner by a second process.

14. The method of claim 13, wherein the second process comprises an oxidation process followed by an etch process.

15. A method, comprising:
forming a semiconductor fin from a substrate;
depositing a first liner on side surfaces of the semiconductor fin and on the substrate;
removing a portion of the first liner to expose a portion of the substrate;
recessing the substrate to extend a height of the semiconductor fin, wherein the semiconductor fin includes a first portion located between the first liner and a second portion below the first portion, and the first portion has a width substantially smaller than a width of the second portion; and
forming a sacrificial gate stack over a portion of the semiconductor fin.

16. The method of claim 15, wherein the semiconductor fin comprises a first plurality of semiconductor layers and a second plurality of semiconductor layers.

17. The method of claim 16, further comprising replacing the sacrificial gate stack with an oxygen-containing layer, a gate dielectric layer, and a gate electrode layer.

18. The method of claim 15, wherein the semiconductor fin comprises a third portion located over the first portion, and the third portion has a width substantially less than the second width.

19. The method of claim 15, wherein the first liner comprises a semiconductor material.

20. The method of claim 15, further comprising depositing a second liner on the first liner prior to removing the portion of the first liner.

* * * * *